US012701808B2

(12) United States Patent
Kotoo

(10) Patent No.: US 12,701,808 B2
(45) Date of Patent: Aug. 4, 2026

(54) SOLID-STATE IMAGING DEVICE, METHOD OF PRODUCING THE SAME, AND ELECTRONIC APPARATUS

(71) Applicant: SONY SEMICONDUCTOR SOLUTIONS CORPORATION, Kanagawa (JP)

(72) Inventor: Kengo Kotoo, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 584 days.

(21) Appl. No.: 18/043,664

(22) PCT Filed: Aug. 16, 2021

(86) PCT No.: PCT/JP2021/029921
§ 371 (c)(1),
(2) Date: Mar. 1, 2023

(87) PCT Pub. No.: WO2022/054501
PCT Pub. Date: Mar. 17, 2022

(65) Prior Publication Data
US 2023/0268368 A1 Aug. 24, 2023

(30) Foreign Application Priority Data
Sep. 10, 2020 (JP) ................................. 2020-152364

(51) Int. Cl.
*H10F 39/00* (2025.01)

(52) U.S. Cl.
CPC ......... *H10F 39/809* (2025.01); *H10F 39/018* (2025.01); *H10F 39/811* (2025.01)

(58) Field of Classification Search
CPC ............................................. H01L 2224/0519
See application file for complete search history.

(56) References Cited

U.S. PATENT DOCUMENTS

2015/0187681 A1* 7/2015 Mahajan ................ H05K 1/113
257/669
2018/0103544 A1* 4/2018 Holbery ................. H05K 1/028
2019/0043910 A1* 2/2019 Miyazawa ............ H10F 39/809

FOREIGN PATENT DOCUMENTS

JP 2006-191081 7/2006
JP 2015-126229 7/2015
(Continued)

OTHER PUBLICATIONS

International Search Report and Written Opinion prepared by the Japan Patent Office on Oct. 21, 2021, for International Application No. PCT/JP2021/029921, 2 pgs.

*Primary Examiner* — Yara B Green
*Assistant Examiner* — Coralie A Nettles
(74) *Attorney, Agent, or Firm* — SHERIDAN ROSS P.C.

(57) ABSTRACT

Electrical connection between mutually facing electrodes is provided. A solid-state imaging device includes: a first semiconductor base; a second semiconductor base bonded to the first semiconductor base; and a conductive polymer, the first semiconductor base including a first semiconductor layer in which a photoelectric conversion unit is provided, a first multilayer wiring layer stacked on the first semiconductor layer, and a first metal pad formed on a surface of the first multilayer wiring layer on a side opposite to the first semiconductor layer, the second semiconductor base including a second semiconductor layer in which an active element is provided, a second multilayer wiring layer stacked on the second semiconductor layer, and a second metal pad on a surface of the second multilayer wiring layer on a side opposite to the second semiconductor layer, the conductive polymer electrically connecting the first metal pad and to the second metal pad.

10 Claims, 19 Drawing Sheets

(56) References Cited

FOREIGN PATENT DOCUMENTS

| JP | 2016-174016 | 9/2016 |
| WO | WO 2017/163926 | 9/2017 |

* cited by examiner $(X=NH/N, S)$

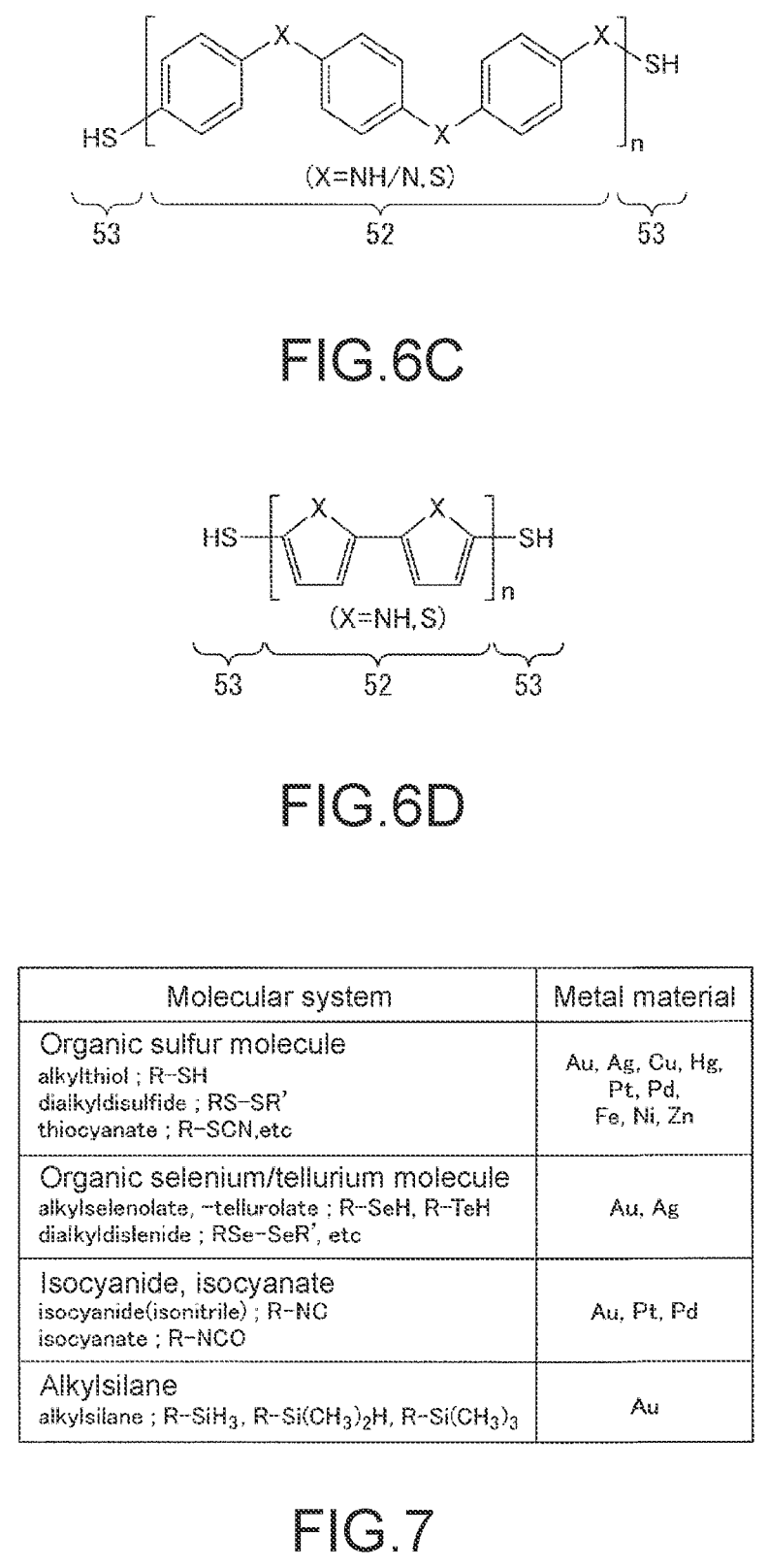

| Molecular system | Metal material |
|---|---|
| Organic sulfur molecule<br>alkylthiol ; R–SH<br>dialkyldisulfide ; RS–SR'<br>thiocyanate ; R–SCN,etc | Au, Ag, Cu, Hg,<br>Pt, Pd,<br>Fe, Ni, Zn |
| Organic selenium/tellurium molecule<br>alkylselenolate, –tellurolate ; R–SeH, R–TeH<br>dialkyldislenide ; RSe–SeR', etc | Au, Ag |
| Isocyanide, isocyanate<br>isocyanide(isonitrile) ; R–NC<br>isocyanate ; R–NCO | Au, Pt, Pd |
| Alkylsilane<br>alkylsilane ; R–SiH$_3$, R–Si(CH$_3$)$_2$H, R–Si(CH$_3$)$_3$ | Au |

FIG.7

| Conjugated system polymer | Representative example |
|---|---|
| Aliphatic conjugated system | Polyacetylene |
| Aromatic conjugated system | Poly(p-phenylene) |
| Mixed-type conjugated system | Poly(p-phenylenevinylene) |
| Heterocyclic conjugated system | Polypyrrole, polythiophene, and PEDOT |
| Heteroatom-containing conjugated system | Polyaniline |
| Multi-chain-type conjugated system | Polyacene (virtual molecule) |
| Two-dimensional conjugated system | Graphene |

FIG.8

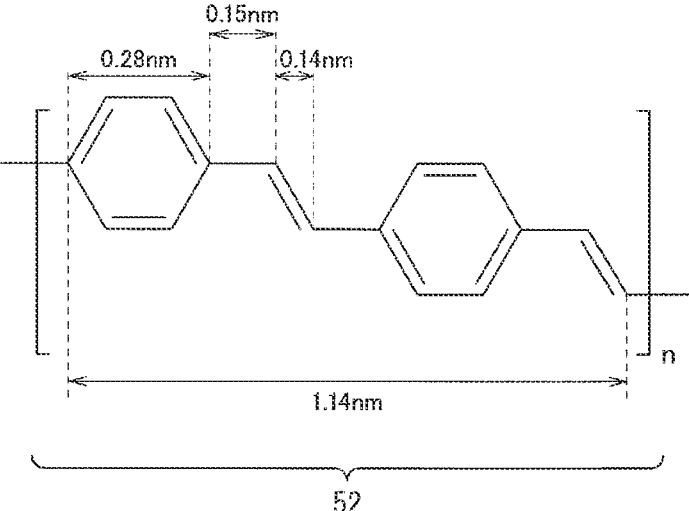

FIG.9

| Polymer name | Skeletal structure | Electrical conductivity |
|---|---|---|
| Polyacetylene (PA) | | $2 \times 10^5$ S/cm |
| Polythiophene (PT) | | $5 \times 10^2$ S/cm |
| Poly(3-methylthiophene) (PMeT) | | $5 \times 10^2$ S/cm |
| Polypyrrole (PPy) | | $5 \times 10^2$ S/cm |

SOLID-STATE IMAGING DEVICE, METHOD OF PRODUCING THE SAME, AND ELECTRONIC APPARATUS

CROSS REFERENCE TO RELATED APPLICATIONS

This application is a national stage application under 35 U.S.C. 371 and claims the benefit of PCT Application No. PCT/JP2021/029921, having an international filing date of 16 Aug. 2021, which designated the United States, which PCT application claimed the benefit of Japanese Patent Application No. 2020-152364, filed 10 Sep. 2020, the entire disclosures of each of which are incorporated herein by reference.

TECHNICAL FIELD

The present technology (technology according to the present disclosure) relates to a solid-state imaging device, a method of producing the same, and an electronic apparatus, and particularly to a technology effectively applied to a solid-state imaging device including two semiconductor bases bonded to each other facing each other, a method of producing the same, and an electronic apparatus.

BACKGROUND ART

In recent years, there is a method of directly bonding electrodes provided on bonding surfaces of semiconductor members to each other, among methods of preparing a three-dimensional integrated circuit or the like by bonding semiconductor members to each other. For example, there is a method of bonding a first substrate on which a light-receiving device is formed and a second substrate on which a peripheral circuit is formed to each other by, for example, Cu electrodes (Cu Pads) provided on the respective substrates.

In such a method, the Cu electrodes and the interlayer insulating films provided on the respective semiconductor members are flattened (CMP) to have the same surface, and the Cu electrodes facing each other and the interlayer insulating films facing each other are bonded to each other (CuCu bonding).

CITATION LIST

Patent Literature

Patent Literature 1: Japanese Patent Application Laid-open No. 2006-191081
Patent Literature 2: Japanese Patent Application Laid-open No. 2016-174016

DISCLOSURE OF INVENTION

Technical Problem

In the above-mentioned bonding, e.g., CuCu bonding, a finer Cu electrode pitch will be desired in the future. However, as the Cu electrode becomes smaller, polishing of the Cu electrode tends to progress more easily when the Cu electrode and the interlayer insulating film are flattened to have the same surface, and the Cu electrode is recessed (Cu Pad recess) with respect to the interlayer insulating film, so that flattening is becoming difficult. When the Cu electrode is recessed, there is a possibility that Cu electrodes facing each other cannot be connected to each other when the substrates are bonded to each other, which may lead to a connection failure in which electricity does not flow.

Further, in the case where a Si film is deposited after flattening the Cu electrode and the interlayer insulating film and the Si film on the Cu electrode is silicided by heat treatment, there is a concern that a short circuit occurs between adjacent Cu electrodes if the silicidation extends beyond the Cu electrode.

It is an object of the present technology to provide a solid-state imaging device capable of electrically connecting mutually facing electrodes to each other, a method of producing the same, and an electronic apparatus.

Solution to Problem

A solid-state imaging device according to an aspect of the present technology include: a first semiconductor base; a second semiconductor base bonded to the first semiconductor base; and a conductive polymer, the first semiconductor base including a first semiconductor layer in which a photoelectric conversion unit for performing photoelectric conversion is provided, a first multilayer wiring layer stacked on the first semiconductor layer, and a first metal pad formed on a surface of the first multilayer wiring layer on a side opposite to a surface thereof on a side of the first semiconductor layer, the second semiconductor base including a second semiconductor layer in which an active element is provided, a second multilayer wiring layer stacked on the second semiconductor layer, and a second metal pad formed on a surface of the second multilayer wiring layer on a side opposite to a surface thereof on a side of the second semiconductor layer, the conductive polymer being interposed between the first metal pad and the second metal pad and electrically connecting the first metal pad and the second metal pad to each other.

A method of producing a solid-state imaging device according to another aspect of the present technology includes:

preparing a first semiconductor base that includes a first semiconductor layer in which a photoelectric conversion unit for performing photoelectric conversion is provided, a first multilayer wiring layer stacked on the first semiconductor layer, and a first metal pad formed on a surface of the first multilayer wiring layer on a side opposite to a surface thereof on a side of the first semiconductor layer, and a second semiconductor base that includes a second semiconductor layer in which an active element is provided, a second multilayer wiring layer stacked on the second semiconductor layer, and a second metal pad formed on a surface of the second multilayer wiring layer on a side opposite to a surface thereof on a side of the second semiconductor layer;

orienting a conductive polymer on at least one of the first metal pad and the second metal pad; and bonding the first multilayer wiring layer of the first semiconductor base and the second multilayer wiring layer of the second semiconductor base to each other.

An electronic apparatus according to another aspect of the present technology includes: the solid-state imaging device.

BRIEF DESCRIPTION OF DRAWINGS

FIG. 6C is a diagram showing another example of the conductive polymer according to the embodiment of the present technology.

FIG. 6D is a diagram showing another example of the conductive polymer according to the embodiment of the present technology.

FIG. 7 is a diagram illustrating types of functional groups of the conductive polymer according to the embodiment of the present technology.

FIG. 8 is a diagram illustrating types of polymers of the conductive polymer according to the embodiment of the present technology.

FIG. 9 is a diagram describing the degree of polymerization of the polymer according to the embodiment of the present technology.

MODE(S) FOR CARRYING OUT THE INVENTION

Figure 1:
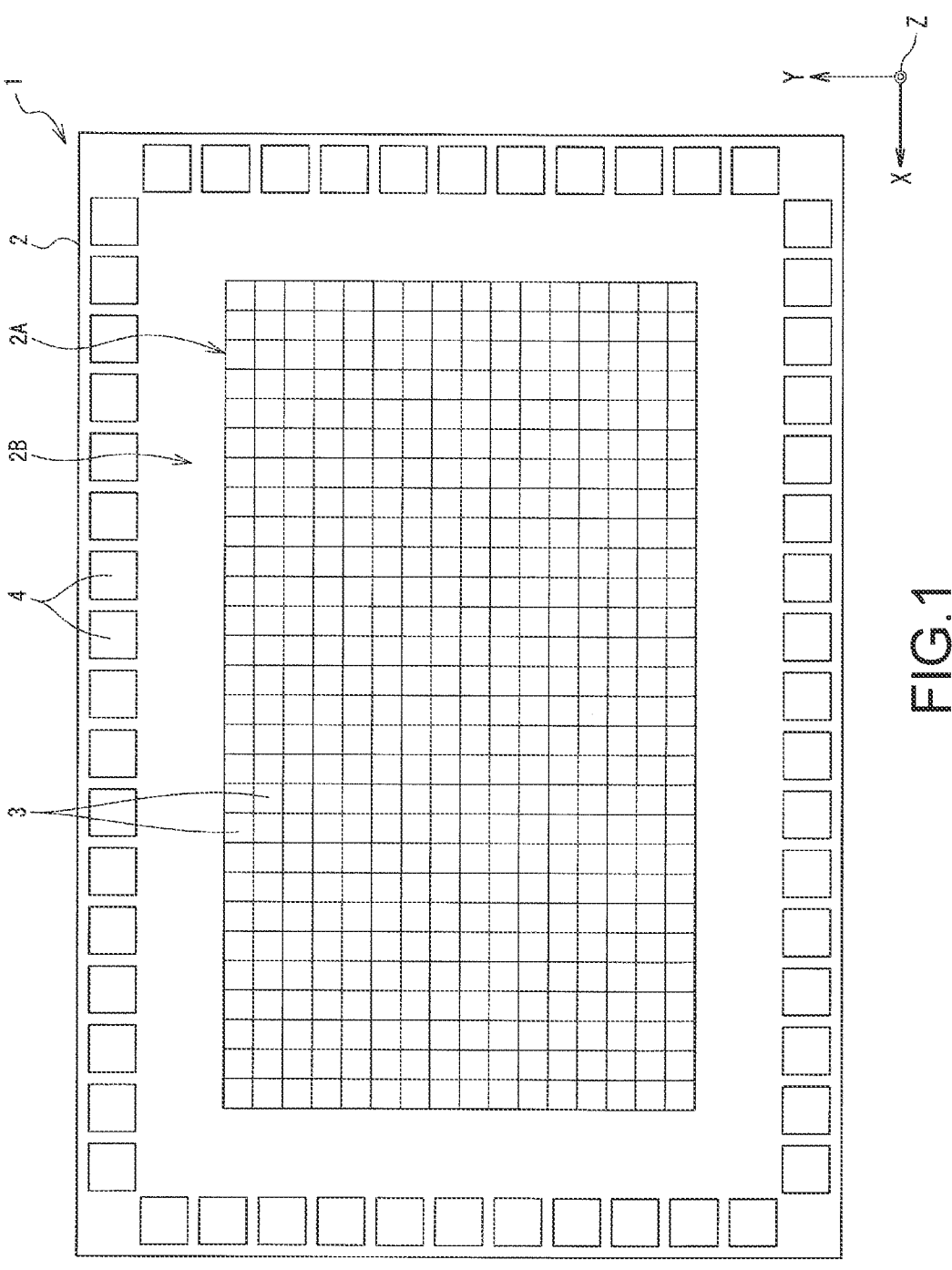
FIG. 1 is a chip layout diagram showing a configuration example of a solid-state imaging device according to an embodiment of the present technology.

Hereinafter, an embodiment of the present technology will be described in detail with reference to the drawings.

Note that in the drawings for describing the embodiment of the present technology, components having the same function will be denoted by the same reference symbols and repeated description thereof will be omitted.

Further, the drawings are schematic and different from the actual ones in some cases. Further, the following embodiment is intended to illustrate devices and methods for embodying the technical idea of the present invention and does not limit the configurations to those described below. That is, the technical idea of the present invention can be modified in various ways within the technical scope described in the claims.

Further, in the following embodiment, in three directions orthogonal to each other in space, a first direction and a second direction orthogonal to each other in the same plane will be respectively referred to as an X direction and a Y direction and a third direction orthogonal to the first direction and the second direction will be referred to as the Z direction. Then, in the following embodiment, the thickness direction of a semiconductor layer will be described as a Z direction.

Embodiment

In this embodiment, an example in which the present technology is applied to as a solid-state imaging device that is a back-illuminated CMOS (Complementary Metal Oxide Semiconductor) image sensor as a photodetector will be described.

«Overall Configuration of Embodiment»

As shown in FIG. 1, a solid-state imaging device 1 according to an embodiment of the present technology mainly includes a sensor chip 2 having a rectangular two-dimensional plane shape in plan view. That is, the solid-state imaging device 1 is amounted on the sensor chip 2. The sensor chip 2 has a rectangular pixel region 2A disposed in the center and a peripheral region 2B disposed outside the pixel region 2A so as to surround the pixel region 2A in a two-dimensional plane.

The pixel region 2A is a light-receiving surface that receives light collected by an optical system (not shown). Then, in the pixel region 2A, a plurality of pixels 3 is arranged in a matrix pattern in a two-dimensional plane including the X direction and the Y direction.

In the peripheral region 2B, a plurality of electrode pads 4 is arranged. Each of the plurality of electrode pads 4 is arrayed, for example, along four sides of the sensor chip 2 in a two-dimensional plane. Each of the plurality of electrode pads 4 is an input/output terminal used when electrically connecting the sensor chip 2 to an external device (not shown).

Figure 2:
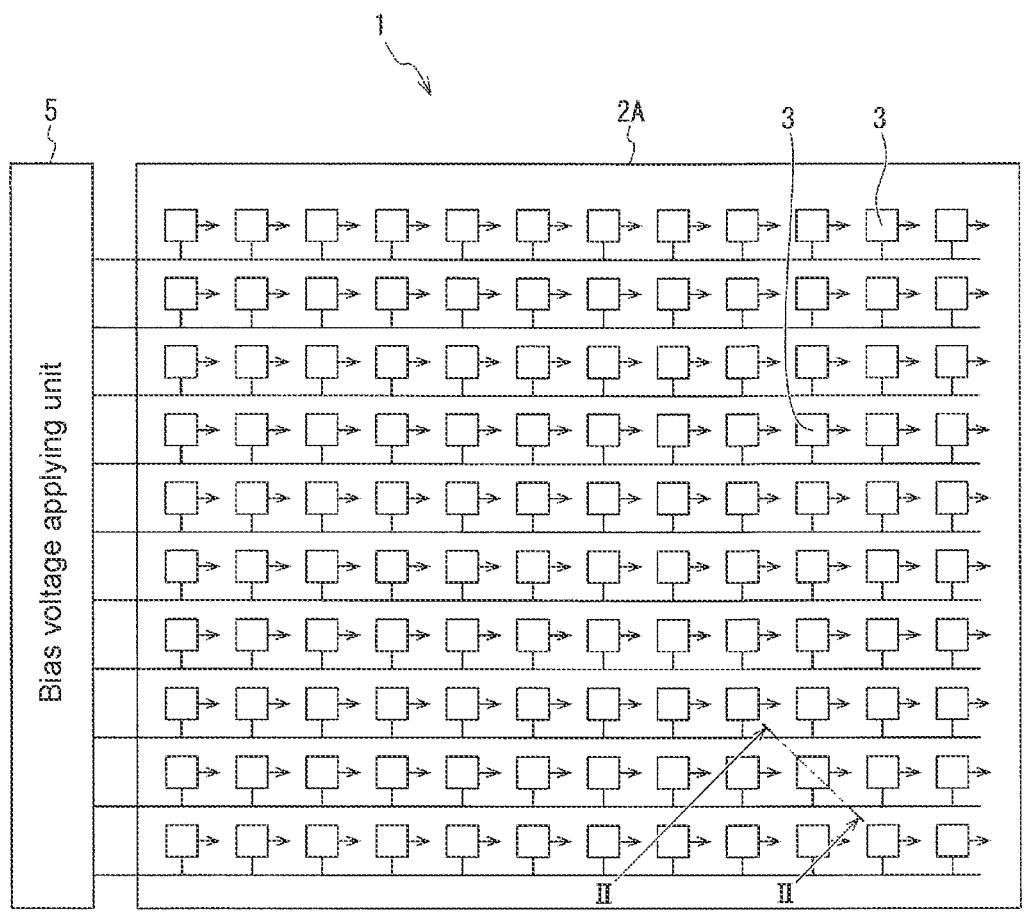
FIG. 2 is a block diagram showing a configuration example of the solid-state imaging device according to the embodiment of the present technology.

As shown in FIG. 2, the sensor chip 2 includes a bias voltage applying unit 5 as well as the pixel region 2A. The bias voltage applying unit 5 applies a bias voltage to each of the plurality of pixels 3 arranged in the pixel region 2A.

Figure 3:
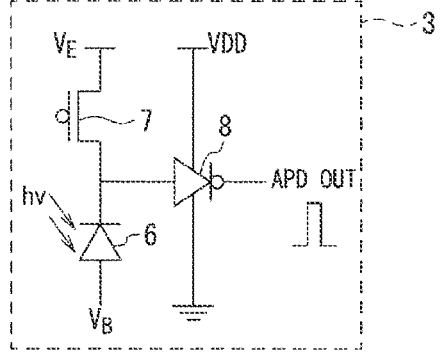
FIG. 3 is an equivalent circuit diagram showing a configuration example of a pixel.

As shown in FIG. 3, each pixel 3 of the plurality of pixels 3 includes, for example, an APD (avalanche photodiode) element 6 as a photoelectric conversion device, a quenching resistance element 7 including, for example, a p-type MOS-FET (Metal Oxide Semiconductor Field Effect Transistor), and an inverter 8 including, for example, a complementary MOSFET (Complementary MOS).

The APD element 6 has an anode connected to the bias voltage applying unit 5 (see FIG. 3) and a cathode connected to a source terminal of the quenching resistance element 7. A bias voltage $V_B$ is applied from the bias voltage applying unit 5 to the anode of the APD element 6. The APD element 6 is a photoelectric conversion device that forms an avalanche multiplication region (depletion layer) when a large negative voltage is applied to the cathode thereof, and is capable of avalanche-multiplying electrons generated by the incidence of one photon.

The quenching resistance element 7 is connected to the APD element 6 in series and has a source terminal connected to the cathode of the APD element 6 and a drain terminal connected to a power source (not shown). An excitation voltage $V_E$ is applied to the drain terminal of the quenching resistance element 7. The quenching resistance element 7 performs, when the voltage due to the electrons avalanche-multiplied by the APD element 6 reaches a negative voltage VBD, quenching in which the electrons multiplied by the APD element 6 are emitted to return the voltage to the initial voltage.

As shown in FIG. 3, the inverter 8 has an input terminal connected to the cathode of the APD element 6 and the source terminal of the quenching resistance element 7, and an output terminal connected to an arithmetic processing unit (not shown) in the subsequent stage. The inverter 8 outputs a received light signal on the basis of the electrons multiplied by the APD element 6. More specifically, the inverter 8 shapes the voltage generated by the electrons multiplied by the APD element 6. Then, the inverter 8 outputs, to the arithmetic processing unit, a received light signal (APDOUT) generated by, for example, the pulse waveform shown in FIG. 3 starting from the arrival time of one photon. For example, the arithmetic processing unit performs, on the basis of the timing generated by the pulse indicating the arrival time of one photon in the respective received light signals, arithmetic processing for obtaining the distance to a subject to obtain the distance for each pixel 3. Then, a distance image in which the distances to the subject detected by the plurality of pixels 3 are arranged in a plane is generated on the basis of these distances.

<Configuration of Sensor Chip>

Figure 4:
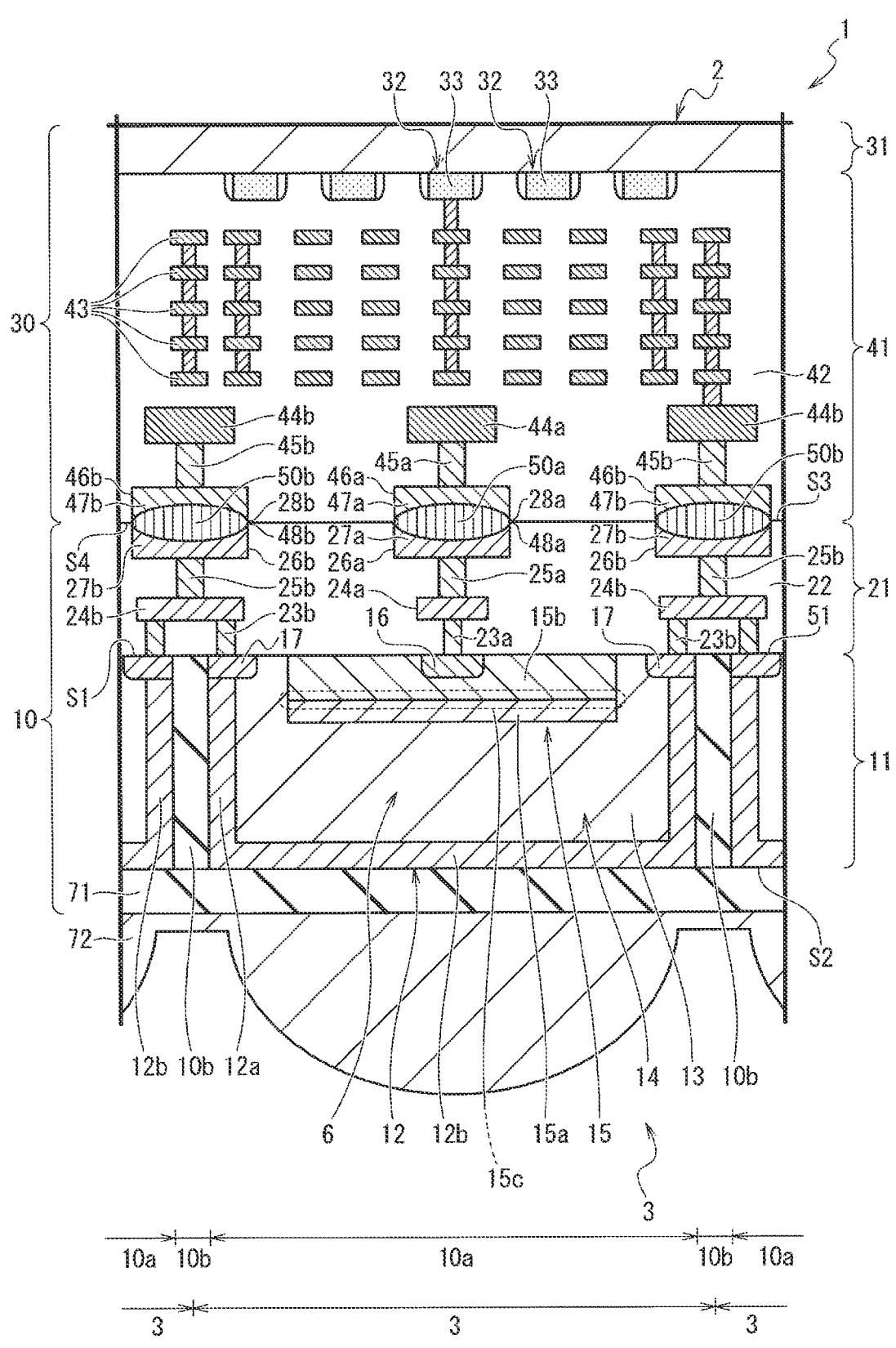
FIG. 4 is a cross-sectional view of a main part showing a cross-sectional structure taken along the cutting line II-II in FIG. 2.

As shown in FIG. 4, the sensor chip 2 includes a first semiconductor base (photoelectric conversion substrate unit) 10 and a second semiconductor base (circuit substrate unit) 30 that are bonded to each other facing each other. The first semiconductor base 10 has the above-mentioned pixel region 2A. The second semiconductor base 30 includes the above-mentioned bias voltage applying unit 5, quenching resistance element 7, inverter 8, and electrode pad 4, a readout circuit that outputs a pixel signal based on charges output from the pixel 3 of the pixel region 2A, and a logic circuit including a vertical drive circuit, a column signal processing circuit, a horizontal drive circuit, an output circuit, and the like.

As shown in FIG. 4, the first semiconductor base 10 includes a first semiconductor layer 11 and a first multilayer wiring layer 21 disposed on the side of a first surface (main surface) S1, of the first surface S1 and a second surface S2 located on opposite sides in the thickness direction (Z direction) of this first semiconductor layer 11. Further, the first semiconductor base 10 includes, on the side of the second surface S2 of the first semiconductor layer 11, a flattening film 71 and a microlens layer 72 sequentially stacked from the side of this second surface S2.

Here, the first surface S1 of the first semiconductor layer 11 is referred to as a main surface or an element formation surface, and the second surface S2 is referred to as a back surface or a light-incident surface in some cases.

The second semiconductor base 30 includes a second semiconductor layer 31 and a second multilayer wiring layer 41 disposed on the side of a first surface, of the first surface and a second surface of this second semiconductor layer 31 located on opposite sides. A MOSFET 32 described below is provided on the first surface of the second semiconductor base 30. Then, the first semiconductor base 10 and the second semiconductor base 30 are bonded to each other by bonding the first multilayer wiring layer 21 and the second multilayer wiring layer 41 to each other. Then, the first multilayer wiring layer 21 and the second multilayer wiring layer 41 are electrically and mechanically connected to each other.

In the first multilayer wiring layer 21 and the second multilayer wiring layer 41, a wire for supplying a voltage to be applied from the bias voltage applying unit 5 to the APD element 6, a wire for extracting the electrons generated by the APD element 6 from the first semiconductor base 10, and the like are formed.

<Configuration of First Semiconductor Base>
(Configuration of First Semiconductor Layer)

As shown in FIG. 4, the pixel 3 has a pixel formation region 10a of the first semiconductor base 10 and includes a separation unit 10b that demarcates this pixel formation region 10a. Then, the pixel formation region 10a is repeatedly arranged via the separation unit 10b in each of the X direction and the Y direction orthogonal to each other. The pixel formation region 10a is electrically and optically separated from an adjacent pixel formation region 10a by the separation unit 10*b*. The above-mentioned APD element 6 is formed in the pixel formation region 10*a* in each of the plurality of pixel formation regions 10*a*.

The separation unit 10*b* extends across the first surface S1 and the second surface S2 of the first semiconductor layer 11 to electrically and optically separate adjacent pixel formation regions 10*a*. The separation unit 10*b* has, for example, a single-layer structure formed of silicon oxide ($SiO_2$) or a multilayer structure in which a metal film is sandwiched between insulation films.

Each pixel 3 of the plurality of pixels 3 includes the APD element 6 as described above. The APD element 6 includes a p-type well region 13 provided in the pixel formation region 10*a* of the first semiconductor base 10 across the first surface S1 and the second surface S2 of the first semiconductor base 10, and a light absorption unit 14 and a multiplication unit 15 sequentially provided in this p-type well region 13 from the side of the second surface S2 of the first semiconductor base 10 toward the side of the first surface S1.

Further, the APD element 6 has an n-type first contact region 16 that is provided in the pixel formation region 10*a* of the first semiconductor base 10 and is electrically connected to an n-type second electrode region 15*b* described below, and a p-type second contact region 17 that is provided in the pixel formation region 10*a* of the first semiconductor base 10 and is electrically connected to a p-type first electrode region 15*a* described below.

Further, the APD element 6 has a p-type charge accumulation region 12 provided to be electrically connected to the p-type well region 13 and the p-type second contact region 17.

The light absorption unit 14 is a photoelectric conversion unit that mainly has the p-type well region 13 and absorbs light that has entered from the side of the second surface S2 (light-incident surface side) of the first semiconductor base 10 to generate electrons (carriers). Then, the light absorption unit 14 transfers the electrons generated by photoelectric conversion to the multiplication unit 15 by an electric field. The p-type well region 13 includes a p-type semiconductor region having the lowest impurity concentration among the semiconductor regions constituting the APD element 6.

The multiplication unit 15 avalanche-multiplies the electrons transferred from the light absorption unit 14. The multiplication unit 15 has the p-type first electrode region 15*a* provided on the side of the first surface S1 of the first semiconductor base 10 and the n-type second electrode region 15*b* provided at a position shallower than the p-type first electrode region 15*a* from the first surface S1 of the first semiconductor base 10 to form p-n junction with the p-type first electrode region 15*a*, an avalanche multiplication region 15*c* being formed at the interface of the p-n junction.

As shown in FIG. 4, the p-type first electrode region 15*a* and the n-type second electrode region 15*b* forming p-n junction are sequentially disposed in the p-type well region 13 from the side of the second surface S2 of the first semiconductor base 10 toward the first surface S1. In this embodiment, the n-type second electrode region 15*b* extends in the depth direction from the first surface S1 of the first semiconductor base 10. The p-type first electrode region 15*a* includes a p-type semiconductor region having the impurity concentration higher than that of the p-type well region 13, and the n-type second electrode region 15*b* includes an n-type semiconductor region having the impurity concentration higher than the p-type well region 13.

The avalanche multiplication region 15*c* is a high electric field region (depletion layer) formed at the interface of the p-n junction between the p-type first electrode region 15*a* and the n-type second electrode region 15*b* by a large negative voltage applied to the n-type second electrode region 15*b*, and multiplies the electrons (e-) generated by one photon that has entered the APD element 6.

The p-type charge accumulation region 12 is provided along the wall surface of the separation unit 10*b*. Then, in this embodiment, the charge accumulation region 12 is provided along the lower bottom surface on the side of the second surface S2 of the pixel formation region 10*a*. That is, the charge accumulation region 12 is provided so as to surround the well region 13 with a first portion 12*a* that is in contact with the side surface of the well region 13 and a second portion 12*b* that is in contact with the bottom surface of the well region 13.

The p-type charge accumulation region 12 includes a p-type semiconductor region having the impurity concentration higher than those of the p-type well region 13 and the p-type first electrode region 15*a*, and accumulates holes as carriers. The p-type charge accumulation region 12 is electrically connected to the p-type second contact region 17 that functions as an anode, and is capable of performing bias adjustment. As a result, the hole concentration of the p-type charge accumulation region 12 is enhanced and the pinning is strengthened, thereby making it possible to suppress the occurrence of dark current, for example.

The p-type second contact region 17 is provided is provided in the surface layer portion on the side of the first surface S1 of the first semiconductor layer 11 so as to surround the outer periphery of the well region 13 and overlap the first portion 12*a* of the p-type charge accumulation region 12. The p-type second contact region 17 reduces ohmic contact resistance with a contact electrode 23*b* described below and functions as an anode. The p-type second contact region 17 includes a p-type semiconductor region having the impurity concentration higher than that of the p-type first electrode region 15*a*.

As shown in FIG. 4, the n-type first contact region 16 is provided between the first surface S1 of the first semiconductor layer 11 and the n-type second electrode region 15*b*. The n-type first contact region 16 includes an n-type semiconductor region having the impurity concentration higher than that of the n-type second electrode region 15*b*, reduces ohmic contact resistance with a contact electrode 23*a* described below, and functions as a cathode.

(Configuration of First Multilayer Wiring Layer)

As shown in FIG. 4, the first multilayer wiring layer 21 of the first semiconductor base 10 is stacked on the first semiconductor layer 11 and has a two-layer wiring structure in which wiring layers are stacked, for example, in two stages via a first interlayer insulating film 22. The first interlayer insulating film 22 may at least partially include a TEOS insulating film deposited using tetraethoxysilane (TEOS) gas. A first metal wire 24*a* and a second metal wire 24*b* are provided in the first wiring layer counted from the side of the first semiconductor layer 11. First metal pads (first base-side metal pad) 27*a* and 27*b* are provided in the second wiring layer counted from the side of the first semiconductor layer 11.

As shown in FIG. 4, the first metal pads 27*a* and 27*b* are formed on a third surface S3 that is a surface of the first multilayer wiring layer 21 on the side opposite to a surface thereof on the side of the first semiconductor layer 11. That is, the first metal pads 27*a* and 27*b* are formed on the surface (third surface S3) of the first interlayer insulating film 22 (insulation layer) stacked on the first semiconductor layer 11, on the side opposite to the surface thereof on the side of the first semiconductor layer 11.

Here, since the surface of the first multilayer wiring layer 21 on the side of the first semiconductor layer 11 corresponds to the surface (bonding surface to be bonded to the second semiconductor base 30) of the first semiconductor base 10 on the side of the first multilayer wiring layer 21, the surface of the first semiconductor base 10 on the side of the first multilayer wiring layer 21 is referred to as the third surface S3 in some cases.

As shown in FIG. 4, the first metal pad 27a is provided in a first recessed portion 26a and the first metal pad 27b is provided in a first recessed portion 26b. The first recessed portions 26a and 26b are formed on the surface (third surface S3) of the first multilayer wiring layer 21 on the side opposite to the surface thereof on the side of the first semiconductor layer 11. The first recessed portion 26a includes an opening 28a on the third surface S3 and the first recessed portion 26b includes an opening 28b on the third surface S3. That is, the first metal pads 27a and 27b are individually embedded in the first recessed portion 26a and the first recessed portion 26b provided in the uppermost insulation layer of the first multilayer wiring layer 21, respectively, while the bonding surface side is exposed from the openings 28a and 28b of the first recessed portion 26a and the first recessed portion 26b.

Then, the contact electrodes 23a and 23b are embedded in the first interlayer insulating film 22 between the first wiring layer and the first semiconductor layer 11. Further, contact electrodes 25a and 25b are embedded in the first interlayer insulating film 22 between the first wiring layer and the second wiring layer.

The contact electrode 23a electrically connects the n-type first contact region 16 and the first metal wire 24a to each other. The contact electrode 23b electrically connects the p-type second contact region 17 and the second metal wire 24b to each other. The contact electrode 25a electrically connects the first metal wire 24a and the first metal pad 27a to each other. The contact electrode 25b electrically connects he second metal wire 24b and the first metal pad 27b to each other.

The first metal pads 27a and 27b are respectively electrically connected to second metal pads (second base-side metal pads) 47a and 47b provided in the second multilayer wiring layer 41 of the second semiconductor base 30 described below via a conductive polymer film 50a.

The first metal pads 27a and 27b and the second metal pads 47a and 47b are each formed of a metal such as copper (Cu), silver (Ag), and gold (Au), and described as being formed using copper.

<Configuration of Second Semiconductor Base>
(Configuration of Second Semiconductor Layer)

As shown in FIG. 4, for example, a plurality of MOSFETs 32 is formed in the second semiconductor layer 31 of the second semiconductor base 30 as field-effect transistors (active elements) constituting circuits such as the bias voltage applying unit 5, a readout circuit, and a logic circuit. As the second semiconductor layer 31, for example, a semiconductor substrate formed of single crystal silicon is used.

(Configuration of Second Multilayer Wiring Layer)

As shown in FIG. 4, the second multilayer wiring layer (multilayer wiring layer) 41 of the second semiconductor base 30 is stacked on the second semiconductor layer 31 and has a seven-layer wiring structure in which wiring layers are stacked in, for example, seven stages via a second interlayer insulating film 42. The second interlayer insulating film 42 may at least partially include a TEOS insulating film. A wire 43 is provided in each of the first to fifth wiring layers counted from the side of the second semiconductor layer 31. The wire 43 of each of the first to fifth wiring layers is electrically connected to the wire 43 of a different wiring layer via a contact electrode embedded in the second interlayer insulating film 42. Then, the wire 43 of the first wiring layer is electrically connected to the MOSFET 32 of the second semiconductor layer 31 via the contact electrode embedded in the second interlayer insulating film 42. In FIG. 4, a configuration in which the wire 43 of the first wiring layer is electrically connected to a gate electrode 33 of the MOSFET 32 via the contact electrode is shown as an example.

Electrode pads 44a and 44b are provided in the sixth wiring layer counted from the side of the second semiconductor layer 31. The second metal pads 47a and 47b are provided in the seventh wiring layer counted from the side of the second semiconductor layer 31.

As shown in FIG. 4, the second metal pads 47a and 47b are formed on a fourth surface S4 that is a surface of the second multilayer wiring layer 41 on the side opposite to a surface thereof on the side of the second semiconductor layer 31. That is, the second metal pads 47a and 47b are formed on the fourth surface S4 that is a surface of the second interlayer insulating film 42 (insulation layer) stacked on the second semiconductor layer 31, on the side opposite to a surface thereof on the side of the second semiconductor layer 31.

Here, since the surface of the second multilayer wiring layer 41 on the side of the second semiconductor layer 31 corresponds to the surface (bonding surface to be bonded to the first semiconductor base 10) of the second semiconductor base 30 on the side of the second multilayer wiring layer 41, the surface of the second semiconductor base 30 on the side of the second multilayer wiring layer 41 is referred to as the fourth surface S4 in some cases.

As shown in FIG. 4, the second metal pad 47a is provided in a second recessed portion 46a, and the second metal pad 47b is provided in a second recessed portion 46b. The second recessed portions 46a and 46b are formed on the fourth surface S4 that is a surface of the second multilayer wiring layer 41 on the side opposite to the surface thereof on the side of the second semiconductor layer 31. The second recessed portion 46a includes an opening 48a on the fourth surface S4, and the second recessed portion 46b includes an opening 48b on the fourth surface S4. That is, the second metal pads 47a and 47b are individually embedded in the second recessed portion 46a and the second recessed portion 46b provided in the uppermost insulation layer of the second multilayer wiring layer 41, respectively, while the bonding surface side is exposed from the openings 48a and 48b of the second recessed portion 46a and the second recessed portion 46b.

Then, contact electrodes 45a and 45b are provided in the second interlayer insulating film 42 between the sixth wiring layer and the seventh wiring layer. The contact electrode 45a electrically connects the electrode pad 44a and the second metal pad 47a to each other. The contact electrode 45b electrically connects the electrode pad 44b and the second metal pad 47b to each other. The electrode pads 44a and 44b are electrically connected to the wire 43 of the lower wiring layer.

The second metal pad 47a is electrically bonded to the first metal pad 27a on the side of the first semiconductor base 10 via the conductive polymer film 50a, and the second metal pad 47b is electrically bonded to the first metal pad 27b on the side of the first semiconductor base 10 via a conductive polymer film 50*b*. Then, the surface (S4) of the second interlayer insulating film 42 (insulation layer) on the side opposite to the surface thereof on the side of the second semiconductor layer 31 is bonded to the surface (S3) of the first interlayer insulating film 22 (insulation layer) on the side opposite to the surface thereof on the side of the first semiconductor layer 11.

(Configuration of Conductive Path)

As shown in FIG. 4, in the second semiconductor base 30, the electrode pad 44*a* is electrically connected to the MOS-FET 32 of the second semiconductor layer 31 via the wire 43 of each wiring layer and each contact electrode of the second interlayer insulating film 42 and is electrically connected to the contact electrode 45*a* and the second metal pad 47*a*. Then, in the first semiconductor base 10, the first metal pad 27*a* is electrically connected to the n-type first contact region 16 via the contact electrode 25*a*, the first metal wire 24*a*, and the contact electrode 23*a*. Then, the second metal pad 47*a* of the second semiconductor base 30 is electrically bonded to the first metal pad 27*a* of the first semiconductor base 10 via the conductive polymer film 50*a*.

Further, as shown in FIG. 4, in the second semiconductor base 30, the electrode pad 44*b* is electrically connected to the MOSFET 32 of the second semiconductor layer 31 via the wire 43 of each wiring layer and each contact electrode of the second interlayer insulating film 42 and is electrically connected to the contact electrode 45*b* and the second metal pad 47*b*. Then, in the first semiconductor base 10, the first metal pad 27*a* is electrically connected to the p-type second contact region 17 of the first semiconductor layer 11 via the contact electrode 25*b*, the second metal wire 24*b*, and the contact electrode 23*b*. Then, the second metal pad 47*b* of the second semiconductor base 30 is electrically bonded to the first metal pad 27*b* of the first semiconductor base 10 via the conductive polymer film 50*b*.

In this way, the equivalent circuit shown in FIG. 3 is realized.

<Configuration of Bonded Portion of Metal Pad>

Next, the bonded portions between the above-mentioned first metal pads 27*a* and 27*b* and the above-mentioned second metal pads 47*a* and 47*b* will be described with reference to the drawings.

Figure 5:
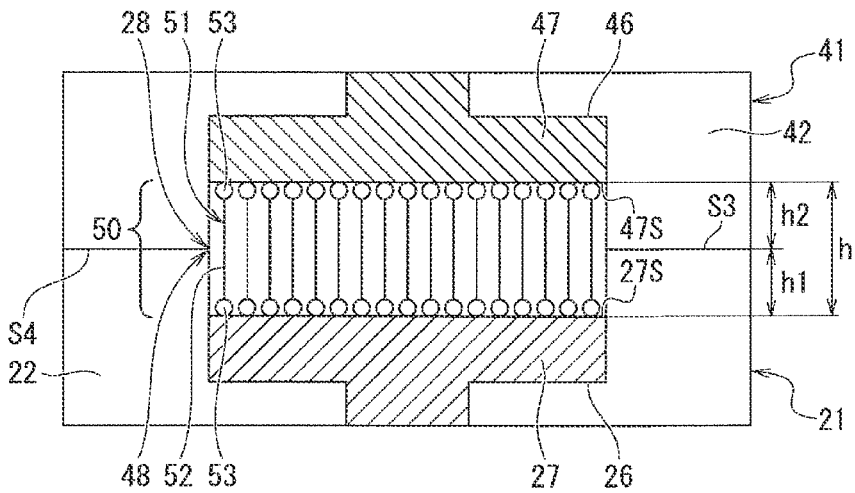
FIG. 5 is a cross-sectional view of a main part showing an enlarged conductive polymer film in FIG. 4.

A first metal pad 27 shown in FIG. 5 corresponds to the above-mentioned first metal pads 27*a* and 27*b*, and the alphanumeric characters at the end of the reference symbol are omitted. Similarly, a first recessed portion 26 corresponds to the above-mentioned first recessed portion 26*a* and first recessed portion 26*b*, and the alphanumeric characters at the end of the reference symbol are omitted. Similarly, an opening 28 corresponds to the above-mentioned openings 28*a* and 28*b*, and the alphanumeric characters at the end of the reference symbol are omitted. Similarly, a second metal pad 47 corresponds to the above-mentioned second metal pads 47*a* and 47*b*, and the alphanumeric characters at the end of the reference symbol are omitted. Similarly, a second recessed portion 46 corresponds to the above-mentioned second recessed portion 46*a* and second recessed portion 46*b*, and the alphanumeric characters at the end of the reference symbol are omitted. Similarly, an opening 48 corresponds to the above-mentioned openings 48*a* and 48*b*, and the alphanumeric characters at the end of the reference symbol are omitted. Similarly, a conductive polymer film 50 corresponds to the above-mentioned conductive polymer films 50*a* and 50*b*, and the alphanumeric characters at the end of the reference symbol are omitted.

As shown in FIG. 5, the first metal pad 27 of the first semiconductor base 10 is electrically and mechanically connected to the second metal pad 47 of the second semiconductor base 30 via the conductive polymer film 50.

<Recess Amount>

As shown in FIG. 5, the first metal pad 27 of the first semiconductor base 10 is recessed from the third surface S3 of the first multilayer wiring layer 21. Then, as shown in FIG. 5, the recessed amount is the distance from the third surface S3 of the first multilayer wiring layer 21 to a surface 27S of the first metal pad 27. This distance is defined as a first recess amount h1. Further, as shown in FIG. 5, the second metal pad 47 of the second semiconductor base 30 is recessed from the fourth surface S4 of the second multilayer wiring layer 41. Then, as shown in FIG. 5, the recessed amount is the distance from the fourth surface S4 of the second multilayer wiring layer 41 to a surface 47S of the second metal pad 47. This distance is defined as a second recess amount h2. Then, the sum of the first recess amount h1 and the second recess amount h2 is defined as a recess amount h (h=h1+h2). That is, the recess amount h is the distance generated between the surface 27S of the first metal pad 27 and the surface 47S of the second metal pad 47.

Here, in order to form a metal pad, a metal layer is deposited on a multilayer wiring layer in which a recessed portion is formed so as to fill the recessed portion, and then the metal layer on the multilayer wiring layer is removed such that the metal layer selectively remains in the recessed portion and the surface of the multilayer wiring layer is flattened by CMP (Chemical Mechanical Polishing). In this formation method, as the dimension of the metal pad becomes smaller, polishing of the metal layer tends to progress more easily than polishing of the interlayer insulating film of the multilayer wiring layer. As a result, the recession of the metal pad as described above occurs in some cases.

In this embodiment, by interposing the conductive polymer film 50 as a spacer between the first metal pad 27 and the second metal pad 47, it is possible to electrically connect the first metal pad 27 and the second metal pad 47 to each other.

<Configuration of Conductive Polymer Film>

As shown in FIG. 5, the conductive polymer film 50 includes a plurality of conductive polymers 51. The conductive polymer 51 is interposed between the first metal pad 27 and the second metal pad 47, and electrically connects the first metal pad 27 and the second metal pad 47 to each other. The plurality of conductive polymers 51 is attracted to each other by van der Waals force, thereby forming the conductive polymer film 50 including the plurality of conductive polymers 51. The plurality of conductive polymers 51 is called a self-assembly molecular (SAM) because they are self-assembled with metal to form a molecular film. That is, the conductive polymer 51 is a conductive SAM.

Then, as shown in FIG. 5 and FIG. 6A to FIG. 6D, each of the conductive polymers 51 includes a polymer 52 obtained by polymerizing n (n≥2) molecules having conductivity. Further, as shown in FIG. 6A to 6D, the number of molecules to be polymerized is defined as the degree of polymerization n.

Further, as shown in FIG. 5 and FIG. 6A to FIG. 6D, the conductive polymer 51 includes a polymer 52 and functional groups 53 provided at both ends of the polymer 52. That is, the conductive polymer 51 includes functional groups at both ends thereof. In the examples in FIG. 6A to FIG. 6D, SH is shown as the functional group 53. Here, S and H in SH respectively represent a sulfur atom and a hydrogen atom. As shown in FIG. 5, one of the functional groups 53 at both ends of the polymer 52 is bonded to the first metal pad 27 and the other is bonded to the second metal pad 47. As a result, the conductive polymer 51 electrically connects the first metal pad 27 and the second metal pad 47 to each other.

Figure 6A:
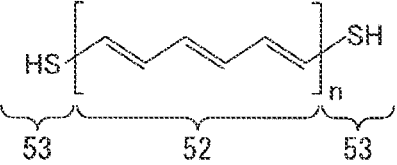
FIG. 6A is a diagram showing an example of a conductive polymer according to the embodiment of the present technology.
Figure 6B:
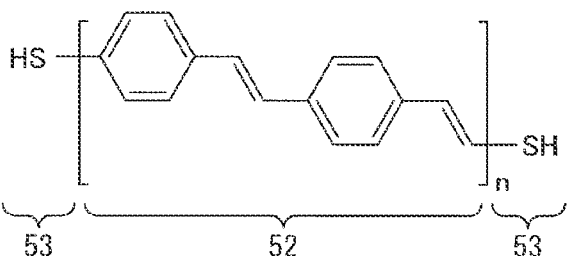
FIG. 6B is a diagram showing another example of the conductive polymer according to the embodiment of the present technology.

As shown in FIG. 6A, the conductive polymer 51 may include polyacetylene in which n molecules are polymerized and SHs provided at both ends thereof. Further, as shown in FIG. 6B, the conductive polymer 51 may include poly(p-phenylenevinylene) in which n molecules are polymerized and SHs provided at both ends thereof. Further, as shown in FIG. 6C, the conductive polymer 51 may include polyaniline (X=NH/N) or poly(p-phenylenesulfide) (X=S) in which n molecules are polymerized and SHs provided at both ends thereof. Further, as shown in FIG. 6D, the conductive polymer 51 may include polypyrrole (X=NH) or polythiophene (X=S) in which n molecules are polymerized and SHs provided at both ends thereof.

Hereinafter, the configuration of the functional group 53 will be described first.

<Configuration of Functional Group>

In the present technology, the conductive polymer 51 is selectively oriented on the metal forming the first metal pad 27 and the second metal pad 47. Here, the term "oriented" means that the functional group of the conductive polymer 51 is bonded to the metal and the conductive polymer 51 is raised, e.g., standing vertically. In this embodiment, since the metal forming the first metal pad 27 and the second metal pad 47 is Cu, the conductive polymer 51 includes SHs, which are the functional groups 53 that can be bonded to Cu, at both ends as shown in FIG. 6A to FIG. 6D.

By forming such functional groups 53 at both ends of the conductive polymer 51, one end of the conductive polymer 51 can be connected to the first metal pad 27 and the other end can be connected to the second metal pad 47. Then, as a result, it is possible to electrically connect the first metal pad 27 and the second metal pad 47 to each other.

As shown in FIG. 7, an organic sulfur molecule is known as the functional group 53 that is self-assembled with Cu. The molecule having sulfur at the end of an alkyl chain is self-assembled with metal to form a molecular film. Here, "R" and "R" in FIG. 7 each represent an alkyl chain.

Further, examples of the metal forming the first metal pad 27 and the second metal pad 47 include materials such as gold (Au) and aluminum (Al) in addition to Cu. In the case where a material other than Cu is used as a metal pad, it only needs to select the functional group 53 that can be well bonded to the material. Examples of the functional group 53 that is bonded to each metal are shown in FIG. 7.

As shown in FIG. 7, examples of the functional group 53 of an organic sulfur molecule include R—SH (alkylthiol) that is bonded to gold (Au), silver (Ag), copper (Cu), and mercury (Hg), RS—SR' (dialkyldisulfide,) that is bonded to platinum (Pt) and palladium (Pd), and R—SCN (thiocyanate) that is bonded to iron (Fe), nickel (Ni), and zinc (Zn).

Further, as shown in FIG. 7, examples of the functional group 53 of an organic selenium/tellurium molecule include R—SeH (alkylselenolate) and R—TeH (-tellurolate) that are bonded to gold (Au) and silver (Ag).

Further, as shown in FIG. 7, examples of the functional group 53 include R—NC (isocyanide (isonitrile)) and R—NCO (isocyanate) that are bonded to gold (Au), platinum (Pt), and palladium (Pd).

Further, as shown in FIG. 7, examples of the functional group 53 include R—SiH$_3$, R—Si(CH$_3$)$_2$H, and R—Si (CH$_3$)$_3$ (alkylsilane) that are bonded to gold (Au).

Since examples of the functional group 53 include various materials as described above, it only needs to select an appropriate functional group 53 in accordance with the metal forming the metal pad. Next, the configuration of the polymer 52 will be described.

<Configuration of Polymer>

(Type of Polymer)

Examples of the type of the polymer 52 include the materials shown in FIG. 8. The polymer 52 is a polymer having π-conjugated system and can be broadly classified into aliphatic, aromatic, mixed-type, heterocyclic, heteroatom-containing, multi-chain-type, and two-dimensional-type in accordance with the molecular structure, as shown in FIG. 8. In the present technology, any structure can be used. As shown in FIG. 8, examples of the aliphatic conjugated system include polyacetylene, examples of the aromatic conjugated system include poly(p-phenylene), examples of the mixed-type conjugated system include poly(p-phenylenevinylene), examples of the heterocyclic conjugated system include polypyrrole, polythiophene, and PEDOT, examples of the heteroatom-containing conjugated system include polyaniline, examples of the multi-chain-type conjugated system include polyacene (virtual molecule), and examples of the two-dimensional-type conjugated system include graphene.

(Degree of Polymerization of Polymer)

The degree of polymerization n of the polymer 52 will be described using poly(p-phenylenevinylene) having a relatively large molecular size as an example. Further, the degree of polymerization n will be described using, as an example, a case where the first recess amount h1 of the first metal pad 27 shown in FIG. 5 is 3 nm, the second recess amount h2 of the second metal pad 47 is 3 nm, and the total recess amount h is 6 nm.

As shown in FIG. 9, poly(p-phenylenevinylene) has a molecular length of 1.14 nm. Since the recess amount h is 6 nm, the length (chain length) of the polymerized poly(p-phenylenevinylene) is six times or more the molecular length, i.e., 1.14 nm×6=6.84 nm or more in the case where the degree of polymerization n is 6 or more (n≥6). As a result, the conductive polymer 51 including the polymerized poly(p-phenylenevinylene) is capable of compensating for the recess amount h and connecting between the first metal pad 27 and the second metal pad 47.

For example, the conductive polymer 51 having a molecular weight of 3000 to 100000 (the degree of polymerization n is 14 to 48) is sufficiently large as a spacer although depending on the synthesis method. The degree of polymerization only needs to have such a value that the chain length of the polymer 52 compensates the recess amount h. As described above, the degree of polymerization n only needs to be set such that the chain length of the polymer 52 is equal to or greater than the recess amount h. Further, the chain length of the polymer 52 may be regarded as the chain length of the conductive polymer 51.

(Electrical Conductivity)

Figures 10A, 10B:
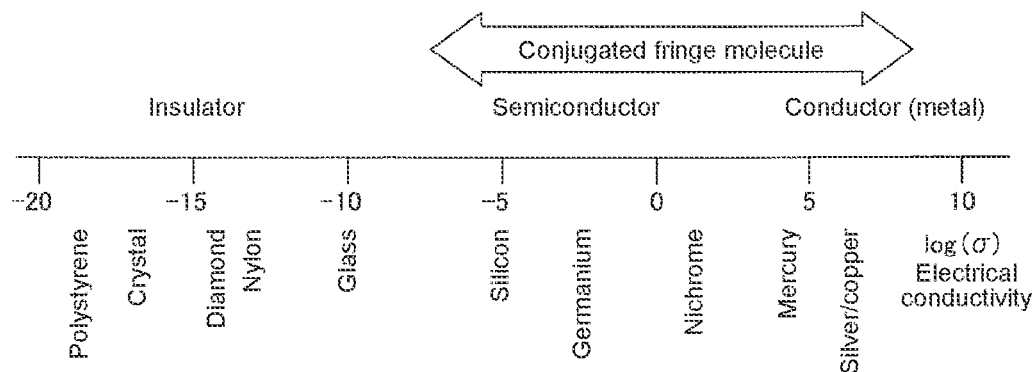
FIG. 10A is a diagram showing electrical conductivity of a conjugated polymer.
FIG. 10B is a diagram showing an example of electrical conductivity of a polymer of the conductive polymer.

The polymer 52 is a polymer having a π-conjugated system. As shown in FIG. 10A, examples of the π conjugated polymer include those having electrical conductivity ranging from a semiconductor to a conductor (metal). Further, examples of the electrical conductivity of the polymer 52 include those shown in FIG. 10B. As shown in FIG. 10B, the electrical conductivity of polyacetylene (PA) is 2×10$^5$ S/cm, and the electrical conductivity of polythiophene (PT) is 5×10$^2$ S/cm. Further, as shown in FIG. 10B, the electrical conductivity of poly(3-methylthiophene) (PMeT) is 5×10$^2$ S/cm, and the electrical conductivity of polypyrrole (PPy) is 5×10$^2$ S/cm.

Further, Heeger et al. (A. J. Heeger et al., Synth. Met., 1988, 22, 371) has estimated the intrinsic electrical conductivity of polyacetylene to be $2.0 \times 10^8$ S/m, which is approximately three times the electrical conductivity of Cu ($6.4 \times 10^7$ S/m). Therefore, it is considered possible to obtain the conductive polymer 51 having electrical conductivity equivalent to that of Cu in accordance with conditions such as polymerization conditions, post-treatment conditions, and the type of a dopant.

(Molecular Weight Distribution, Flexibility)

Figure 11A:
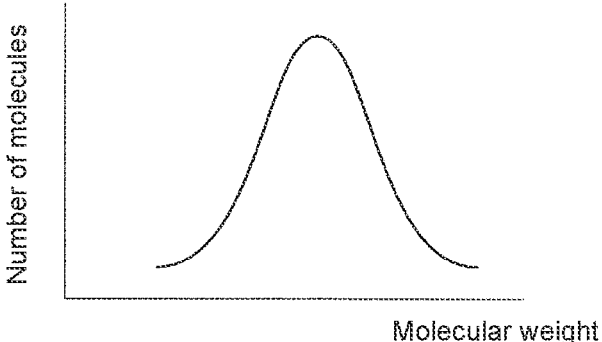
FIG. 11A is a diagram showing the number of molecules with respect to the molecular weight to the polymer.

In general, the molecular weight of a polymer has a distribution according to the difference in the degree of polymerization. For example, as shown in FIG. 11A, the number of molecules (number of polymers) with respect to the molecular weight of a polymer has a distribution. The fact that the molecular weight of a polymer has a distribution implies that the degree of polymerization of a polymer and the length of a polymer (chain length) also have distributions. That is, both a polymer having a long polymer chain and a polymer having a short polymer chain are present.

Figure 11B:
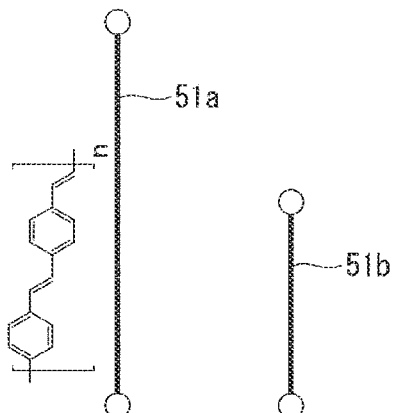
FIG. 11B is a diagram showing variations in chain length of the conductive polymer.

Therefore, in the conductive polymer film 50, the conductive polymers 51 having different chain lengths are present. For example, as shown in FIG. 11B, the conductive polymer 51 of the conductive polymer film 50 includes a first conductive polymer 51a having a first chain length and a second conductive polymer 51b having a second chain length shorter than the first chain length. Further, the recess amount h also varies within the surface of a semiconductor wafer and between semiconductor wafers in some cases. Even in such a case, the first metal pad 27 and the second metal pad 47 are electrically bonded to each other by the conductive polymer 51 because the chain length of the conductive polymer 51 has a distribution.

Figure 11C:
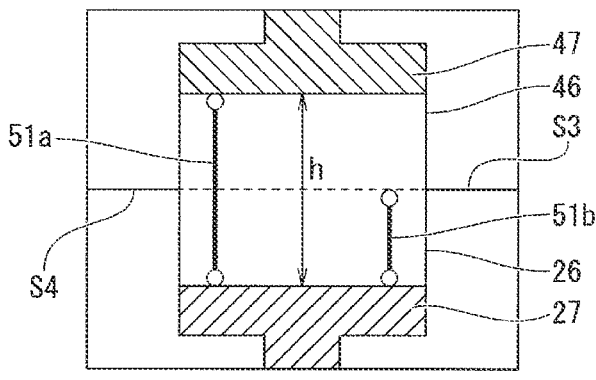
FIG. 11C is a diagram showing a case where a recess amount is large.

For example, in the case where the recess amount h is large, the chain length of the second conductive polymer 51b is smaller than the recess amount h as shown in FIG. 11C, and thus, the second conductive polymer 51b is not capable of connecting the first metal pad 27 and the second metal pad 47 to each other. However, the first conductive polymer 51a having the chain length longer than the second conductive polymer 51b is capable of connecting the first metal pad 27 and the second metal pad 47 to each other. As a result, electricity passes between the first metal pad 27 and the second metal pad 47 via the first conductive polymer 51a having the long chain length.

Figure 11D:
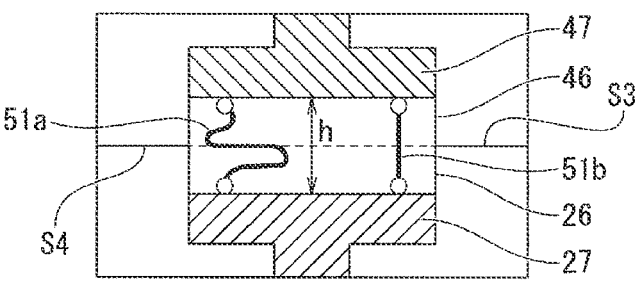
FIG. 11D is a diagram showing a case where the recess amount is small.

Further, for example, in the case where the recess amount h is small, as shown in FIG. 11D, the second conductive polymer 51b having the small chain length connects the first metal pad 27 and the second metal pad 47 to each other, and the first conductive polymer 51a having the chain length longer than the recess amount h also connects the first metal pad 27 and the second metal pad 47 to each other while being bended. The conductive polymer 51 can be bent because it has flexibility. As a result, electricity passes between the first metal pad 27 and the second metal pad 47 via both the first conductive polymer 51a having the long chain length and the second conductive polymer 51b having the short chain length.

As described above, in the case where the recess amount h is large, the first conductive polymer 51a having the large chain length plays a role of a spacer to cause electricity to pass. However, the second conductive polymer 51b having the small chain length does not contribute to the conduction. Conversely, in the case where the recess amount h is small, the first conductive polymer 51a contributes to conduction regardless of the magnitude of the chain length.

That is, for the recess amount h that varies within the surface of a semiconductor wafer and between semiconductor wafers, electricity can be caused to flow by the conductive polymer 51 having the chain length according to the recess amount. Further, since the conductive polymer 51 has flexibility, it is capable of contributing to electrical connection between the first metal pad 27 and the second metal pad 47 by being bent.

<Synthesis of Conductive Polymer>

Figure 12:
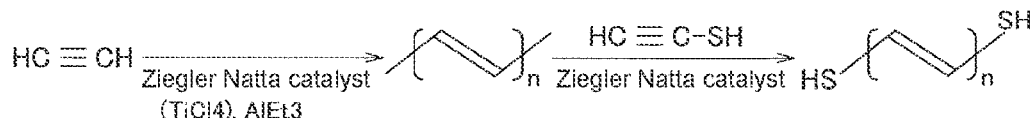
FIG. 12 is a diagram showing a synthesis example of the conductive polymer according to the embodiment of the present technology.

How such a conductive polymer 51 is synthesized will be described using an example. For example, polyacetylenediol that is a conductive SAM is synthesized as shown in FIG. 12. As shown in FIG. 12, acetylene is polymerized by a Ziegler-Natta catalyst ((TiCl4), AlEt3) and SHs are bonded thereto by a Ziegler-Natta catalyst. Here, as SHs, an SH protecting group may be used in some cases.

«Method of Producing Solid-State Imaging Device»

Figure 13A:
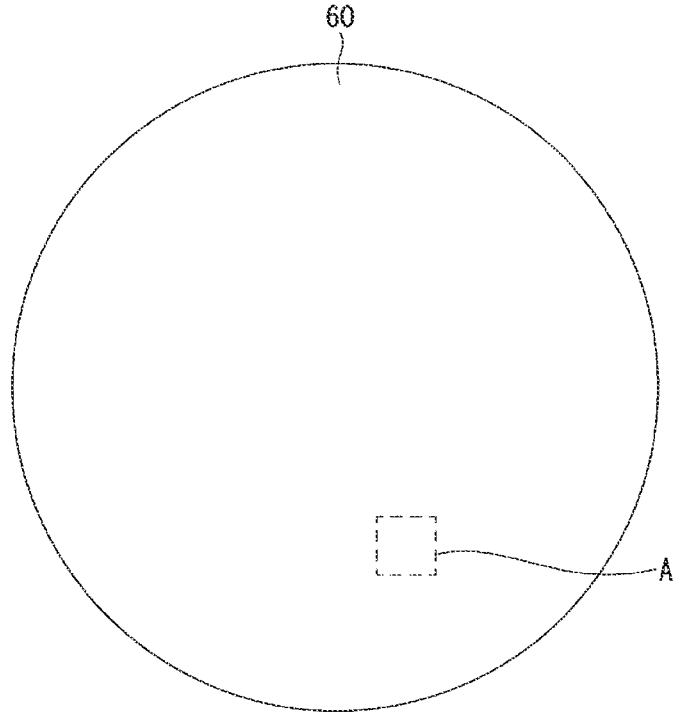
FIG. 13A is a diagram showing a planar configuration of a wafer.
Figure 13B:
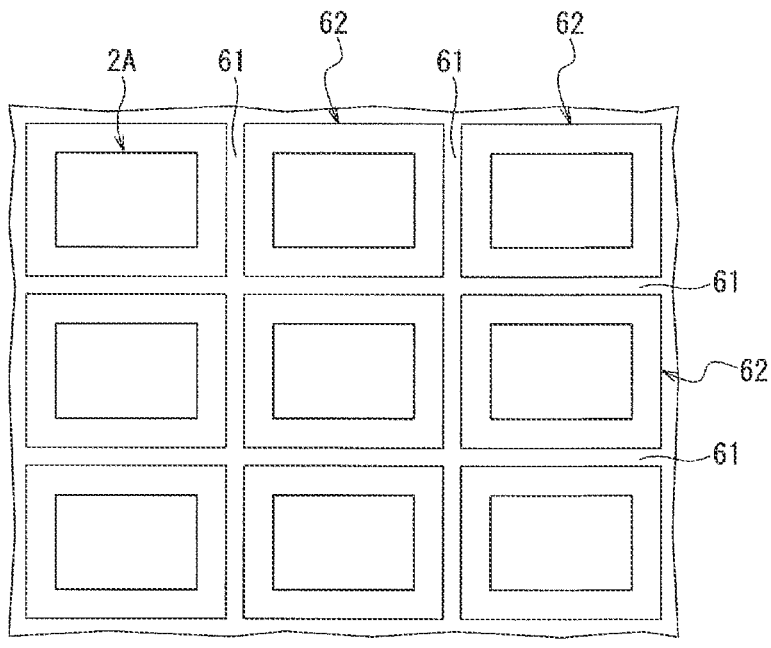
FIG. 13B is a diagram showing a configuration of a chip formation region by enlarging an A region in FIG. 13A.

Next, a method of producing the solid-state imaging device 1 according to this embodiment will be described with reference to the drawings. FIG. 13A is a diagram showing a planar configuration of a wafer. FIG. 13B is a diagram showing a configuration of a chip formation region by enlarging an A region in FIG. 13A. As shown in FIG. 13A and FIG. 13B, the solid-state imaging device 1 is produced in a chip formation region 62 of a semiconductor wafer 60. The chip formation region 62 includes a plurality of chip formation regions that is demarcated by scribe lines 61 and arranged in a matrix pattern. In FIG. 13B, nine chip formation regions 62 are shown. Then, this plurality of chip formation regions 62 is individually divided into pieces along the scribe lines 61 to form the sensor chip 2 on which the solid-state imaging device 1 is mounted. The chip formation regions 62 are divided into pieces after the production process described below is performed.

Note that the scribe lines 61 are not physically formed.

In the method of producing the solid-state imaging device 1 according to this embodiment, a first semiconductor wafer 63 including the first semiconductor base 10 and a second semiconductor wafer 64 including the second semiconductor base 30 are bonded to each other (see FIG. 20A) to form the semiconductor wafer 60 including the first semiconductor layer 11 and the second semiconductor layer 31 (FIG. 13A). At this time, the first semiconductor wafer 63 and the second semiconductor wafer 64 are bonded to each other while the first multilayer wiring layer 21 of the first semiconductor base 10 and the second multilayer wiring layer 41 of the second semiconductor base 30 face each other, i.e., the third surface S3 of the first multilayer wiring layer 21 and the fourth surface S4 of the second multilayer wiring layer 41 face each other, referring to FIG. 4.

Next, the first semiconductor layer 11 on the side of the second surface is grinded and polished by, for example, a CMP method to reduce the thickness of the first semiconductor layer 11, and the flattening film 71 and the microlens layer 72 are sequentially stacked on the first semiconductor layer 11 on the side of the second surface S2.

Here, the bonding processing between the first semiconductor wafer 63 including the first semiconductor base 10 and the second semiconductor wafer 64 including the second semiconductor base 30 will be mainly described and description of another detailed production process of the solid-state imaging device 1 will be omitted.

<Description of Wafer Bonding Processing>

The conductive polymer film 50 is formed before bonding the first semiconductor wafer 63 including the first semiconductor base 10 and the second semiconductor wafer 64 including the second semiconductor base 30 to each other. In this regard, the wafer bonding processing including the process of forming the conductive polymer film 50 to the process of bonding the first semiconductor base 10 and the second semiconductor base 30 to each other will be described below using the flowchart of FIG. 14 with reference to FIG. 15A to FIG. 21B. Note that FIG. 15A, FIG. 16A, FIG. 17A, FIG. 18A, FIG. 19A, and FIG. 20 show the wafer state and FIG. 15B, FIG. 16B, FIG. 17B, FIG. 18B, FIG. 19B, and FIG. 20B show the metal pad portion.

Figure 14:
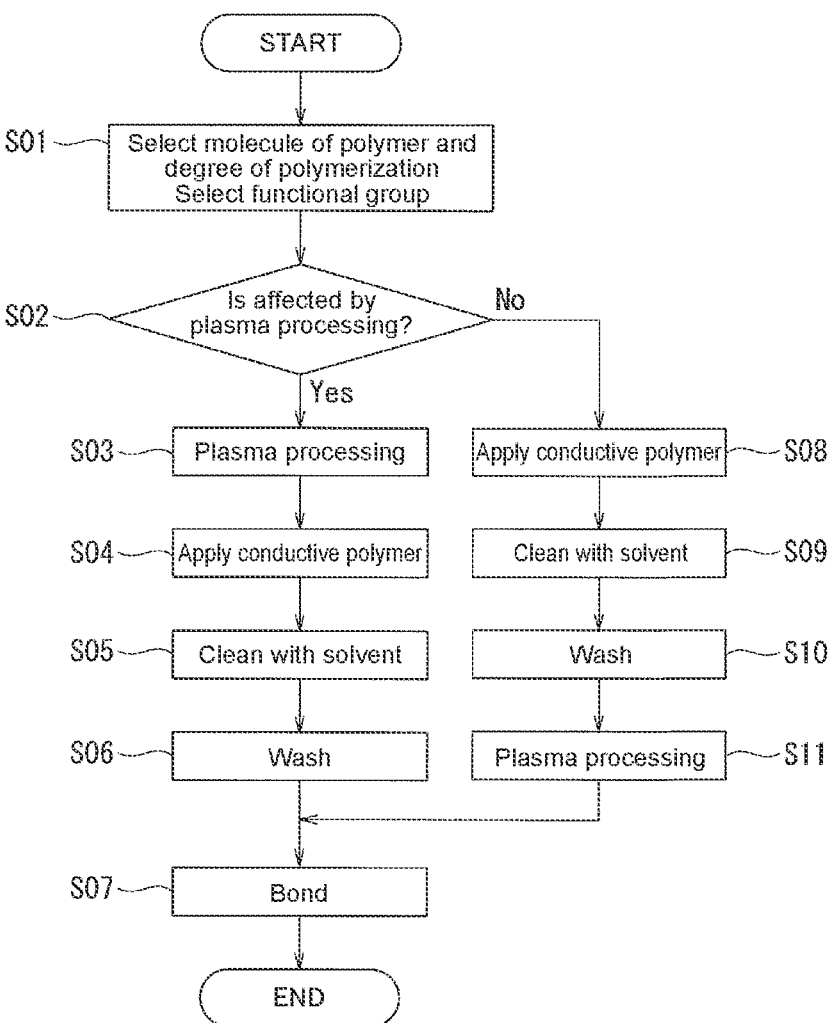
FIG. 14 is a flowchart describing wafer bonding processing according to the embodiment of the present technology.

First, as shown in FIG. 14, the conductive polymer 51 forming the conductive polymer film 50 is selected (Step S01). Specifically, a molecule of the polymer 52 of the conductive polymer 51, the degree of polymerization n of the molecule, and a functional group are selected. The type of the polymer is selected on the basis of the electrical conductivity necessary in the solid-state imaging device. As the degree of polymerization n of the molecule forming the polymer 52 of the conductive polymer 51, the degree of polymerization according to the recess amount h is selected. That is, the degree of polymerization is selected such that the chain length of the conductive polymer 51 is equal to or longer than the recess amount h. Then, as the functional group, a functional group that can be bonded to the metal forming the first metal pad 27 and the second metal pad 47 is selected. The conductive polymer 51 selected in this way is applied to the wafer while being dissolved in a solvent.

Next, whether or not the selected conductive polymer 51 is affected by plasma processing is determined (Step S02). This is to determine whether or not there is an effect such as breaking of the polymer due to the collision of ions in the plasma processing. In the case where it is determined to be affected (Step S02: YES), the processing proceeds to Step S03.

In Step S03, plasma processing is performed on each of the first semiconductor wafer 63 including the first semiconductor base 10 and the second semiconductor wafer 64 including the second semiconductor base 30 to activate the third surface S3 of the first semiconductor base 10 and the fourth surface S4 of the second semiconductor base 30.

Next, a solvent L1 in which the conductive polymer 51 is dissolved is applied to the first semiconductor wafer 63 including the first semiconductor base 10 (Step S04), the excess conductive polymer 51 applied to the surface of the first interlayer insulating film 22 is removed with a rinse solvent L2 (Step S05), and the rinse solvent L2 remaining on the first semiconductor wafer 63 is removed by washing using washing water L3 (Step S06). Then, the second semiconductor wafer 64 including the second semiconductor base 30 and the first semiconductor wafer 63 including the first semiconductor base 10 washed in Step S06 are bonded to each other (Step S07), and thus the processing ends.

Note that in the case where it is determined in Step S02 that the selected conductive polymer 51 is not affected by the collision of ions in the plasma processing (Step S02: NO), the processing proceeds to Step S08 and the solvent L1 in which the conductive polymer 51 is dissolved is applied to the first semiconductor wafer 63 including the first semiconductor base 10 (Step S08). Then, the excess conductive polymer 51 applied to the surface of the first interlayer insulating film 22 is removed with the rinse solvent L2 (Step S09), the rinse solvent L2 remaining on the first semiconductor wafer 63 is removed by washing using the washing water L3 (Step S10), plasma processing is performed on each of the second semiconductor wafer 64 including the second semiconductor base 30 and the first semiconductor wafer 63 including the first semiconductor base 10 after the washing (Step S11), and the processing proceeds to Step S07. These Steps S08 to S11 are different from the Steps S03 to S07 in that the conductive polymer 51 is oriented on the first metal pad 27 and then plasma processing is performed thereon. However, the individual Steps S08, S9, S10, and S11 are the same as the above-mentioned Steps S04, S05, S06, and S03 corresponding thereto.

Figure 15A:
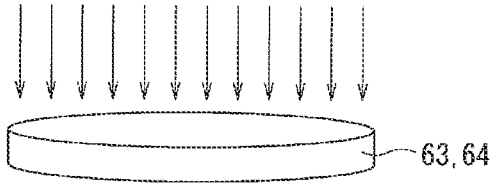
FIG. 15A is a schematic process diagram describing the wafer bonding processing according to the embodiment of the present technology.
Figure 15B:
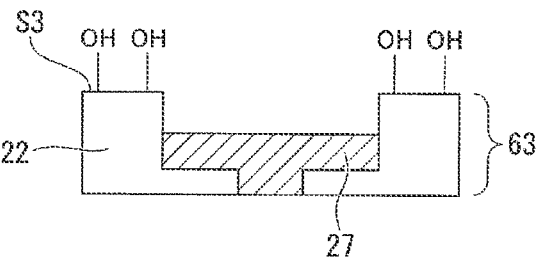
FIG. 15B is a schematic process cross-sectional view describing the wafer bonding processing according to the embodiment of the present technology.

Hereinafter, the above-mentioned Steps S03, S04, S05, and S06 will be described in detail with reference to the drawings. In Step S03, when the surfaces of the first semiconductor wafer 63 and the second semiconductor wafer 64 are activated by plasma processing as shown in FIG. 15A, OH groups are generated on the surfaces of the activated first interlayer insulating film 22 and the activated second interlayer insulating film 42. In FIG. 15B, OH groups are generated on the surface of the first interlayer insulating film 22.

Figure 16A:
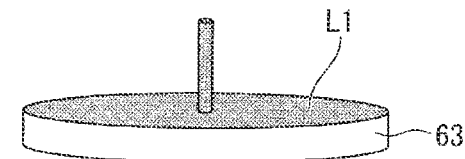
FIG. 16A is a schematic process diagram following FIG. 15A.
Figure 16B:
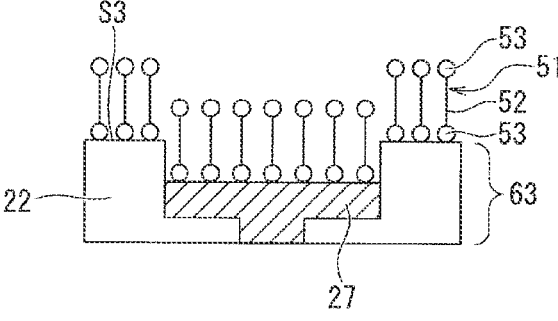
FIG. 16B is a schematic process cross-sectional view following FIG. 15B.

Next, in Step S04, as shown in FIG. 16A, the solvent L1 in which the conductive polymer 51 is dissolved is applied to the third surface S3 of the first semiconductor wafer 63. This application is performed by so-called spin coating in which the solvent L1 in which the conductive polymer 51 is dissolved is potted on the third surface S3 of the first semiconductor wafer 63 and the first semiconductor wafer 63 is caused to rotate to thinly spread the solvent L1 and apply the thinly spread solvent L1 to the entire surface of the first semiconductor wafer 63. After the application, as shown in FIG. 16B, the conductive polymer 51 adheres to the entire surface of the first semiconductor wafer 63.

When the solvent L1 is applied to the first metal pad 27, one of the functional groups 53 at both ends of the conductive polymer 51 is bonded to the first metal pad 27. As a result, the conductive polymer 51 is oriented on the first metal pad 27.

Here, since the first metal pad 27 is Cu and the functional group 53 of the conductive polymer 51 is SH that can be bonded to Cu, one of the functional groups 53 at both ends of the conductive polymer 51 is selectively bonded to the first metal pad 27 as shown in FIG. 5. Then, the conductive polymers 51 in which the functional groups 53 are selectively bonded to Cu interact with each other by van der Waals force to stand as shown in FIG. 5 and are self-assembled with Cu. Then, the conductive polymer film 50 including such a plurality of conductive polymers 51 is formed.

Further, at this point, the conductive polymer 51 is present also on the first interlayer insulating film 22. However, SH that is the functional group 53 does not interact (e.g., hydrogen bond) with the OH group generated on the surface of the first interlayer insulating film 22. Therefore, the excess conductive polymer 51 is removed by washing and does not remain on the first interlayer insulating film 22.

Figure 17A:
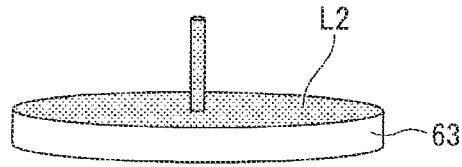
FIG. 17A is a schematic process diagram following FIG. 16A.
Figure 17B:
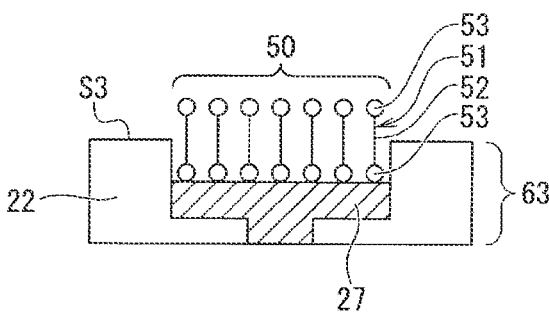
FIG. 17B is a schematic process cross-sectional view following FIG. 16B.

In the next Step S05, the first semiconductor wafer 63 is cleaned with the rinse solvent L2 as shown in FIG. 17A. As a result, the conductive polymer 51 applied to the surface of the first interlayer insulating film 22 is removed as shown in FIG. 17B, and the conductive polymer film 50 including the plurality of conductive polymers 51 oriented on the first metal pad 27 selectively remains.

Figure 18A:
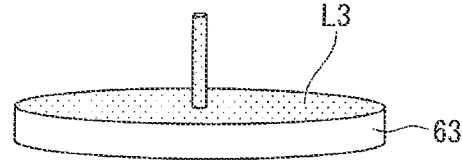
FIG. 18A is a schematic process diagram following FIG. 17A.
Figure 18B:
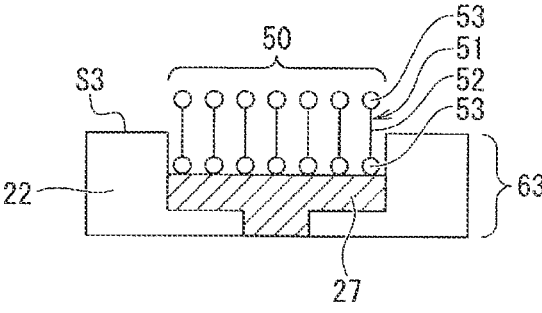
FIG. 18B is a schematic process cross-sectional view following FIG. 17B.

Then, in the next Step S06, the first semiconductor wafer 63 is washed by washing using the washing water L3 as shown in FIG. 18A and FIG. 18B. As a result, the rinse solvent L2 remaining on the surface of the first interlayer insulating film 22 is removed. As shown in FIG. 18B, the conductive polymer film 50 remains unchanged in this process.

Figure 19A:
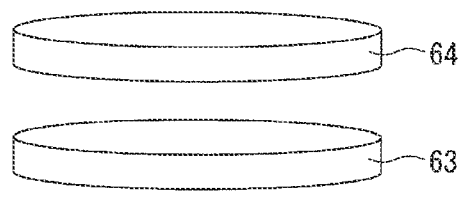
FIG. 19A is a schematic process diagram following FIG. 18A.
Figure 19B:
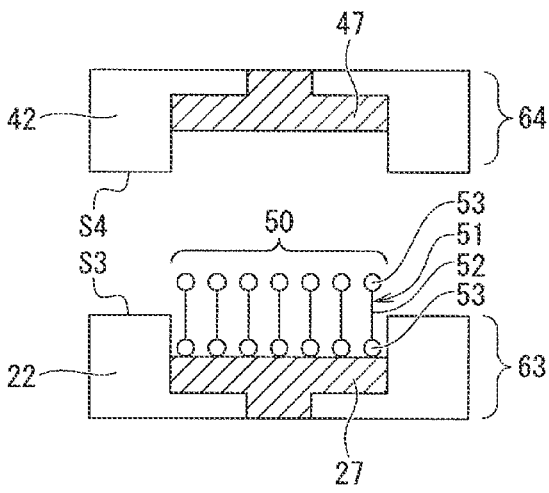
FIG. 19B is a schematic process cross-sectional view following FIG. 18B.
Figure 20A:
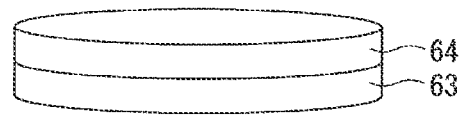
FIG. 20A is a schematic process diagram following FIG. 19A.
Figure 20B:
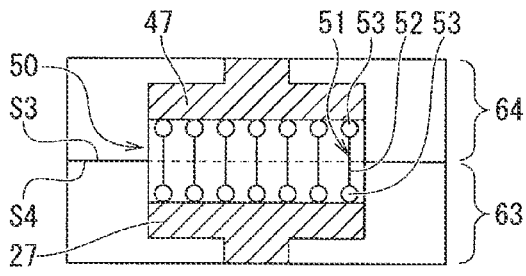
FIG. 20B is a schematic process cross-sectional view following FIG. 19B.

In the next Step S05, the first semiconductor wafer 63 is bonded to the second semiconductor wafer 64. First, as shown in FIG. 19A and FIG. 19B, the second semiconductor wafer 64 to be bonded to the first semiconductor wafer 63 is prepared. Then, the first semiconductor wafer 63 and the second semiconductor wafer 64 are bonded to each other. Here, the term "bonded" means that the first semiconductor wafer 63 and the second semiconductor wafer 64 are bonded to each other as shown in FIG. 20A and FIG. 20B and annealing is performed while the first semiconductor wafer 63 and the second semiconductor wafer 64 to each other.

First, the bonding between the first semiconductor wafer 63 and the second semiconductor wafer 64 will be described. As shown in FIG. 20A and FIG. 20B, when the third surface S3 of the first semiconductor wafer 63 and the fourth surface S4 of the second semiconductor wafer 64 are brought into contact with each other, the other of the functional groups 53 at both ends of the conductive polymer 51, i.e., the functional group 53 that is not bonded to the first metal pad 27, is selectively bonded to the second metal pad 47 as shown in FIG. 5. As a result, the first metal pad 27 is electrically connected to the second metal pad 47 via the conductive polymer film 50.

Further, when the third surface S3 of the first semiconductor wafer 63 and the fourth surface S4 of the second semiconductor wafer 64 are brought into contact with each other, the first interlayer insulating film 22 and the second interlayer insulating film 42 are bonded to each other. Then, by annealing (heat treatment) the first semiconductor wafer 63 and the second semiconductor wafer 64 bonded to each other, a dehydration condensation reaction occurs between the OH groups on the surface of the first interlayer insulating film 22 and the OH groups on the surface of the second interlayer insulating film 42, thereby completing the bonding. In this bonding between the surface of the first interlayer insulating film 22 and the surface of the second interlayer insulating film 42, a hydrogen bond is converted into a covalent bond by annealing. As a result, the bonding between the first interlayer insulating film 22 and the second interlayer insulating film 42 becomes stronger.

Figure 21A:
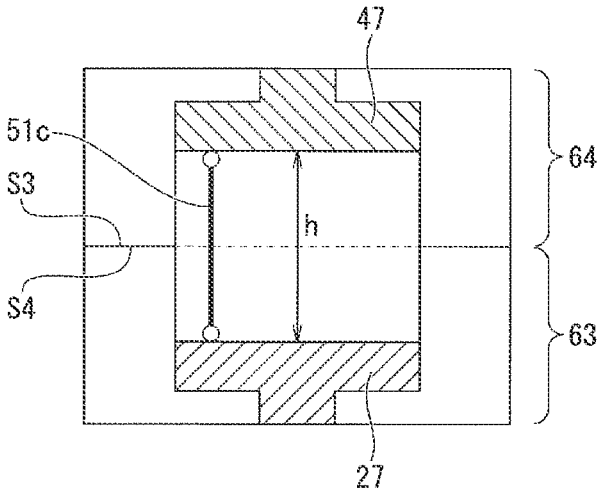
FIG. 21A is a process cross-sectional view showing the conductive polymer before annealing in the wafer bonding processing according to the embodiment of the present technology.

Further, in this annealing, Cu forming the first metal pad 27 and the second metal pad 47 expands by heat. For example, a case where the recess amount h before annealing is 6 nm as shown in FIG. 21A is considered. Further, the conductive polymer 51c that is included in the conductive polymer film 50 and electrically connects the first metal pad 27 and the second metal pad 47 to each other while being straight is considered. Further, a case where the first metal pad 27 and the second metal pad 47 expand by 0.5 nm after annealing as shown in FIG. 21B, for example, and the recess amount h after the annealing is 5 nm is considered.

Figure 21B:
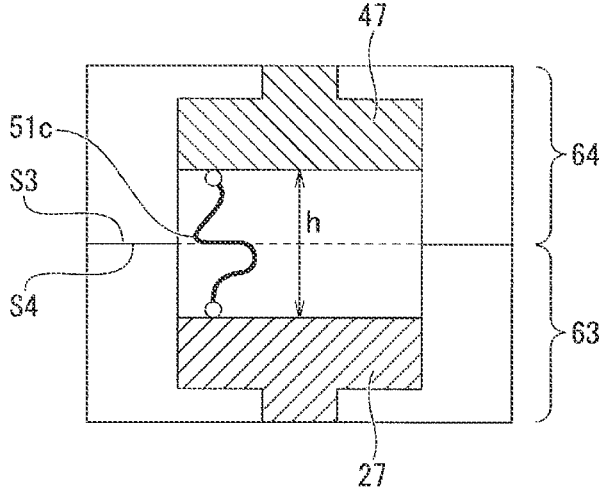
FIG. 21B is a process cross-sectional view showing the conductive polymer after annealing in the wafer bonding processing according to the embodiment of the present technology.

Even in the case where the recess amount h is reduced by annealing, the conductive polymer 51c is capable of bending while the functional groups 53 are bonded to the first metal pad 27 and the second metal pad 47 as shown in FIG. 21B because the conductive polymer 51c has flexibility. As a result, even in the case where the recess amount h is reduced by annealing, the electrical connection between the first metal pad 27 and the second metal pad 47 by the conductive polymer 51 can be maintained.

Further, in the past, a wafer has been bonded at an annealing temperature of approximately 400° C. However, since the annealing temperature can be lowered (e.g., approximately 200° C.), an organic material such as the conductive polymer 51 can be applied to a device.

Effects of Embodiment

Next, the main effects of this embodiment will be described.

In the solid-state imaging device 1 according to this embodiment, even in the case where the first metal pad 27 and the second metal pad 47 are recessed to generate the recess amount h, it is possible to improve the connection failure between the first metal pad 27 and the second metal pad 47 and electrically connect them to each other by interposing the conductive polymer film 50 as a spacer between the first metal pad 27 and the second metal pad 47.

Further, in the solid-state imaging device 1 according to this embodiment, even in the case where the recess amount h is large enough that the first metal pad 27 and the second metal pad 47 are not bonded to each other even when they expand by heat treatment, it is possible to improve the connection failure between the first metal pad 27 and the second metal pad 47 and electrically connect them to each other by interposing the conductive polymer film 50 as a spacer between the first metal pad 27 and the second metal pad 47.

Further, in the solid-state imaging device 1 according to this embodiment, since the conductive polymer 51 is selectively oriented on the metal forming the first metal pad 27 and the second metal pad 47, adjacent metal pads, e.g., the first metal pad 27a and the second metal pad 47a and the first metal pad 27b and the second metal pad 47b shown in FIG. 4 are not short-circuited.

Further, in the solid-state imaging device 1 according to this embodiment, since the conductive polymer 51 included in the conductive polymer film 50 has flexibility and can be bent, it is possible to more reliably perform the contact and bonding between the interlayer insulating films as compared with the technology in which metal pads are bonded to each other by engaging with recesses and projections. Further, in the technology in which metal pads are bonded to each other by engaging with recesses and projections, it has been necessary to design the recessed side in consideration of the alignment accuracy of bonding. However, in the solid-state imaging device 1 according to this embodiment, since the sizes of the first metal pad 27 and the second metal pad 47 can be the same, the design restrictions are reduced.

Further, in the solid-state imaging device 1 according to this embodiment, since the functional groups 53 that can be bonded to the metal forming the first metal pad 27 and the second metal pad 47 are provided at both ends of the conductive polymer 51, the conductive polymer 51 is capable of electrically connecting the first metal pad 27 and the second metal pad 47 to each other.

Further, in the solid-state imaging device 1 according to this embodiment, since the first conductive polymer 51a having a long chain length and the second conductive polymer 51b having a chain length shorter than that of second conductive polymer 51a are present, it is possible to electrically connect the first metal pad 27 and the second metal pad 47 to each other even in the case where the recess amount h varies within the surface of the semiconductor wafer and between the semiconductor wafers.

Note that although an image sensor that generates a distance image as an example of the solid-state imaging device 1 has been described in the above-mentioned embodiment, the solid-state imaging device may be an image sensor that generates a two-dimensional image.

Further, although a case where the conductive polymer 51 has flexibility has been described in the above-mentioned embodiment, the conductive polymer 51 does not necessarily need to have flexibility. In this case, the chain length of the conductive polymer 51 only needs to be approximately the same as the recess amount h, e.g., the same length as the recess amount h.

Further, although a case where a molecule of a polymer is selected on the basis of the electrical conductivity necessary in the solid-state imaging device 1 in Step S01 in FIG. 14 has been described in the above-mentioned embodiment, a molecule having electrical conductivity equivalent to that of the metal forming the first metal pad 27 and the second metal pad 47 may be selected.

Further, although a case where the conductive polymer 51 of the conductive polymer film 50 is oriented on the first metal pad 27 has been described in the above-mentioned embodiment, the conductive polymer 51 of the conductive polymer film 50 may be oriented on the second metal pad 47.

Further, the conductive polymer 51 of the conductive polymer film 50 may be oriented on both the first metal pad 27 and the second metal pad 47. In this case, when the first semiconductor wafer 63 and the second semiconductor wafer 64 are brought into contact with each other, the other of the functional groups 53 at both ends of the conductive polymer 51 formed on the first metal pad 27, i.e., the functional group 53 that is not bonded to the first metal pad 27, passes through the gaps between the plurality of conductive polymers 51 formed on the second metal pad 47 and is bonded to the second metal pad 47. This is because the conductive polymers 51 are attracted to each other by van der Waals force but are not bonded to each other, and thus, there are gaps between them. The other of the functional groups 53 at both ends of the conductive polymer 51 formed on the second metal pad 47, i.e., the functional group 53 that is not bonded to the second metal pad 47, also passes through the gaps between the plurality of conductive polymers 51 formed on the first metal pad 27 and is bonded to the first metal pad 27, similarly.

Further, although bonding the first semiconductor wafer 63 and the second semiconductor wafer 64 to each other means that the first semiconductor wafer 63 and the second semiconductor wafer 64 are brought into contact with each other to be bonded to each other and are annealed while being bonded to each other in the above-mentioned embodiment, the first semiconductor wafer 63 and the second semiconductor wafer 64 only need to be brought into contact with each other to be bonded to each other without annealing.

Further, although a case where the surface of the first interlayer insulating film 22 and the surface of the second interlayer insulating film 42 are bonded to each other has been described in the above-mentioned embodiment, the surface of the first interlayer insulating film 22 and the surface of the second interlayer insulating film 42 are not necessarily need to be bonded to each other if the bonding strength between the functional groups 53 of the conductive polymer 51 and the first metal pad 27 and the second metal pad 47 is high.

«Example of Solid-State Imaging Device»

Example 1

Figure 22A:
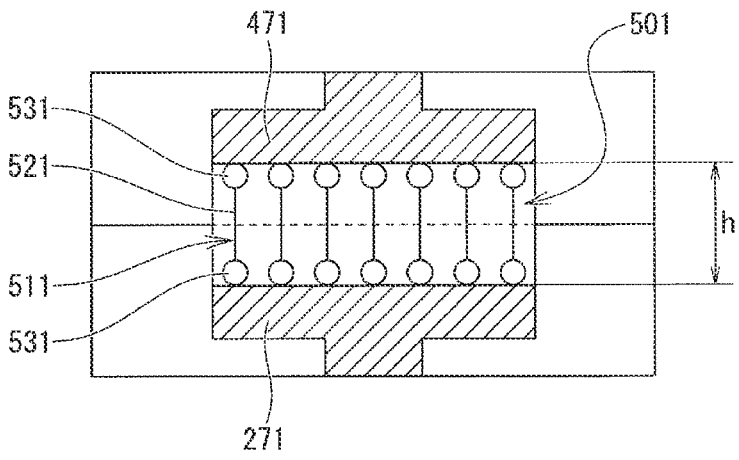
FIG. 22A is a diagram showing an Example of the present technology.

In this Example 1, the material forming a first metal pad 271 and a second metal pad 471 of the solid-state imaging device 1 is Cu, and the recess amount h between the first metal pad 271 and the second metal pad 471 shown in FIG. 22A is 6.0 nm.

Figure 22B:
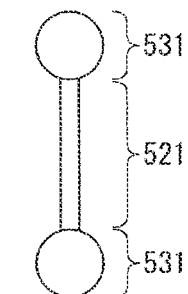
FIG. 22B is diagram showing the Example of the present technology.
Figure 22C:
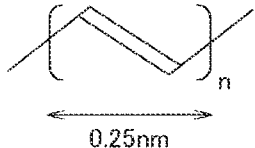
FIG. 22C is diagram showing the Example of the present technology.

Further, in this Example 1, polyacetylene (PA) shown in FIG. 22C was used for a polymer 521 of a conductive polymer 511 shown in FIG. 22A and FIG. 22B, and SH that can be bonded to Cu was used for a functional group 531 shown in FIG. 22A and FIG. 22B.

Further, the molecular length of polyacetylene is 0.25 nm as shown in FIG. 22C. In this case, the necessary amount of the degree of polymerization n is 24 on the basis of the following formula: $n=6.0/0.25=24$.

Then, as shown in FIG. 22A, a conductive polymer film 501 including a plurality of conductive polymers 511 is formed between the first metal pad 271 and the second metal pad 471.

Example 2

Figure 23A:
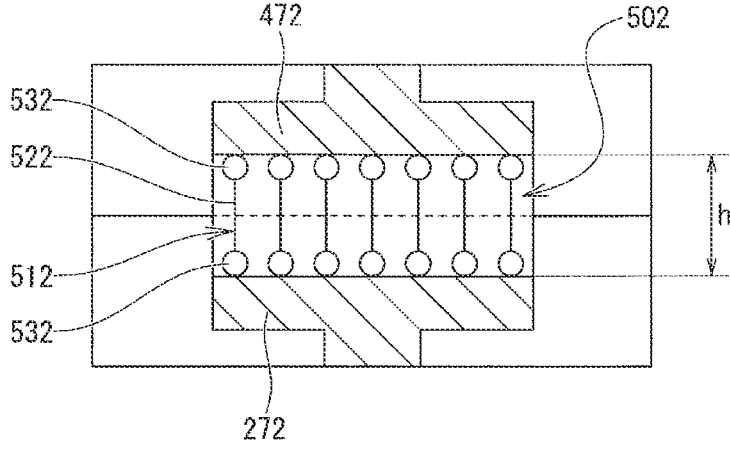
FIG. 23A is a diagram showing a different Example of the present technology.

In this Example 2, the material forming a first metal pad 272 and a second metal pad 472 of the solid-state imaging device 1 is Ag, and the recess amount h between the first metal pad 272 and the second metal pad 472 shown in FIG. 23A is 6.0 nm.

Figure 23B:
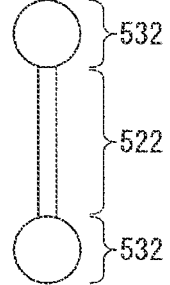
FIG. 23B is a diagram showing the different Example of the present technology.

Further, in this Example 2, polyacetylene (PA) shown in FIG. 22C was used for a polymer 522 of a conductive polymer 512 shown in FIG. 23A and FIG. 23B, and one of SH, SeH, and TeH that can be bonded to Ag was used for a functional group 532 shown in FIG. 23A and FIG. 23B.

Further, the molecular length of polyacetylene is 0.25 nm as shown in FIG. 22C. In this case, the necessary amount of the degree of polymerization n is 24 on the basis of the following formula: $n=6.0/0.25=24$.

Then, as shown in FIG. 23A, a conductive polymer film 502 including a plurality of conductive polymers 512 is formed between the first metal pad 272 and the second metal pad 472.

Example 3

Figure 24A:
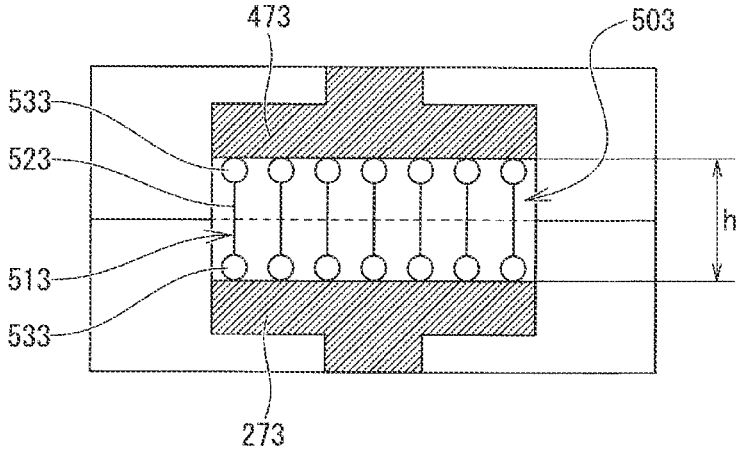
FIG. 24A is a diagram showing the different Example of the present technology.

In this Example 3, the material forming a first metal pad 273 and a second metal pad 473 of the solid-state imaging device 1 is Au, and the recess amount h between the first metal pad 273 and the second metal pad 473 shown in FIG. 24A is 6.0 nm.

Figure 24B:
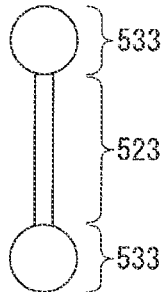
FIG. 24B is a diagram showing the different Example of the present technology.

Further, in this Example 3, polyacetylene (PA) shown in FIG. 22C was used for a polymer 523 of a conductive polymer 513 shown in FIG. 24A and FIG. 24B, and one of SH, SeH, TeH, NCO, and $SiH_3$ that can be bonded to Au was used for a functional group 533 shown in FIG. 24A and FIG. 24B.

Further, the molecular length of polyacetylene is 0.25 nm as shown in FIG. 22C. In this case, the necessary amount of the degree of polymerization n is 24 on the basis of the following formula: $n=6.0/0.25=24$.

Then, as shown in FIG. 24A, a conductive polymer film 503 including a plurality of conductive polymers 513 is formed between the first metal pad 273 and the second metal pad 473.

«Configuration Example of Electronic Apparatus»

Figure 25:
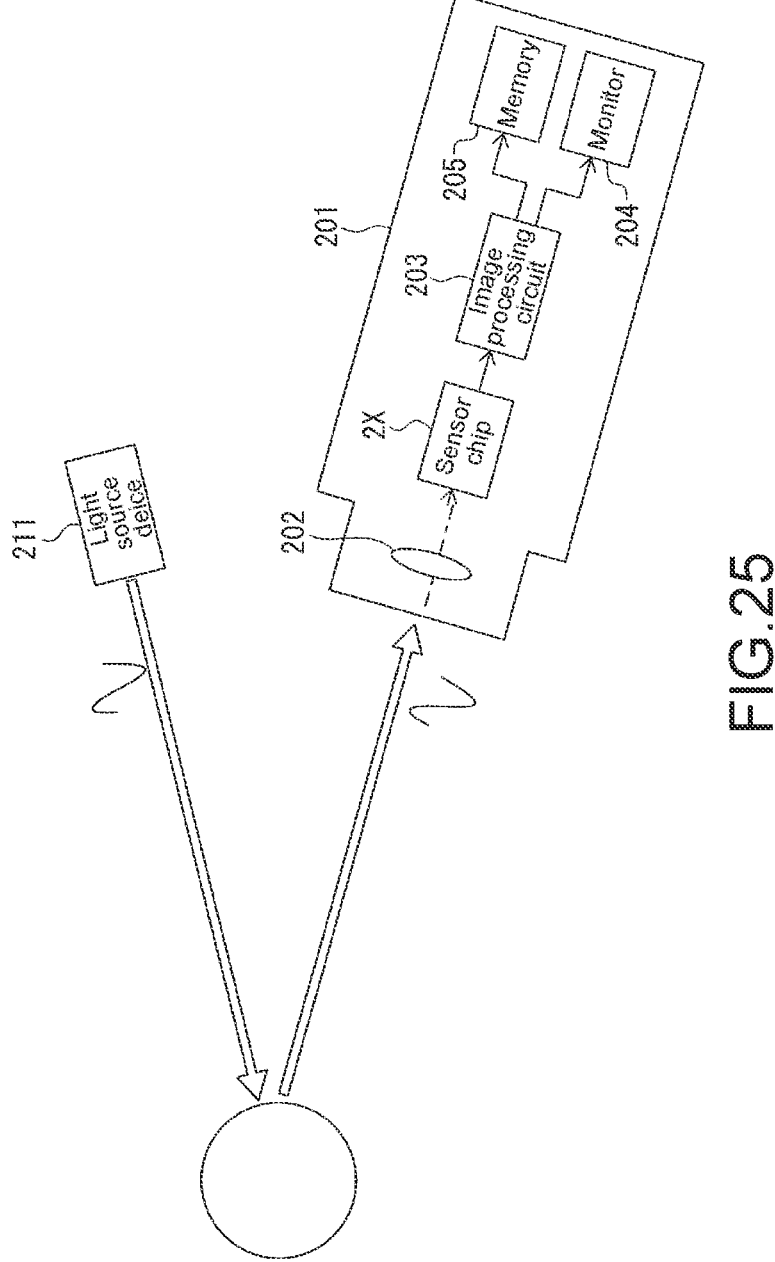
FIG. 25 is a block diagram showing a configuration example of a distance image apparatus using a sensor chip according to the present technology.

As shown in FIG. 25, a distance image apparatus 201 as an electronic apparatus includes an optical system 202, a sensor chip 2X, an image processing circuit 203, a monitor 204, and a memory 205. The distance image apparatus 201 is capable of acquiring a distance image corresponding to the distance to a subject by receiving light (modulated light or pulsed light) that is projected from a light source deice 211 to the subject and reflected by the surface of the subject.

The optical system 202 includes one or more lenses, guides image light (incident light) from a subject to the sensor chip 2X, and forms an image of the light on the light-receiving surface (sensor unit) of the sensor chip 2X.

The sensor chip 2 on which the solid-state imaging device 1 according to the above-mentioned embedment is mounted is applied to the sensor chip 2X, and a distance signal indicating the distance obtained from the received light signal (APD OUT) output from the sensor chip 2X is supplied to the image processing circuit 203.

The image processing circuit 203 performs image processing of constructing a distance image on the basis of the distance signal supplied from the sensor chip 2X, and the distance image (image data) obtained by the image processing is supplied to the monitor 204 to be displayed or supplied to the memory 205 to be stored (recorded).

In the distance image apparatus 201 configured as described above, by applying the above-mentioned sensor chip 2, it is possible to calculate the distance to a subject on the basis of only a received light signal from the pixel 3 that is highly stable, and generate a distance image with high accuracy. That is, the distance image apparatus 201 is capable of acquiring a more accurate distance image.

《Usage Example of Image Sensor》

The above-mentioned sensor chip 2 (image sensor) can be used in various cases of sensing light such as visible light, infrared light, ultraviolet light, and X-rays, for example, as described below.

Apparatus for capturing images used for viewing, such as a digital camera and a portable device with a camera function Apparatus used for traffic purposes, such as an in-vehicle sensor for imaging the front, rear, surrounding, and interior of automobiles for safe driving such as automatic stopping or for recognizing the state of drivers, etc., a monitoring camera for monitoring traveling vehicles and roads, and range-finding sensor for range-finding between vehicles, etc.

Apparatus used in home appliances such as a TV, a refrigerator, and an air conditioner to image the gestures of users and perform device operations in accordance with the gestures Apparatus used for medical and healthcare purposes, such as an endoscope and an apparatus that performs angiography by receiving infrared light Apparatus used for security purposes, such as a monitoring camera for security purposes and a camera for personal identification purposes Apparatus used for cosmetic purposes, such as a skin measuring apparatus for imaging skin and a microscope for imaging scalp Apparatus used for sports purposes, such as an action camera for sports purposes and a wearable camera Apparatus used for agricultural purposes, such as a camera for monitoring the states of fields and crops It should be noted that the present technology may also take the following configurations.

(1) A solid-state imaging device, including:

a first semiconductor base;

a second semiconductor base bonded to the first semiconductor base; and a conductive polymer, the first semiconductor base including a first semiconductor layer in which a photoelectric conversion unit for performing photoelectric conversion is provided, a first multilayer wiring layer stacked on the first semiconductor layer, and a first metal pad formed on a surface of the first multilayer wiring layer on a side opposite to a surface thereof on a side of the first semiconductor layer, the second semiconductor base including a second semiconductor layer in which an active element is provided, a second multilayer wiring layer stacked on the second semiconductor layer, and a second metal pad formed on a surface of the second multilayer wiring layer on a side opposite to a surface thereof on a side of the second semiconductor layer, the conductive polymer being interposed between the first metal pad and the second metal pad and electrically connecting the first metal pad and the second metal pad to each other.

(2) The solid-state imaging device according to (1) above, in which the conductive polymer includes, at both ends thereof, functional groups that are bonded to the first metal pad and the second metal pad.

(3) The solid-state imaging device according to (1) or (2) above in which the conductive polymer has a chain length equal to or greater than a recess amount that is a sum of a recessed amount of the first metal pad and a recessed amount of the second metal pad.

(4) The solid-state imaging device according to (1) above, in which the conductive polymer includes a first conductive polymer having a first chain length and a second conductive polymer having a second chain length shorter than the first chain length.

(5) The solid-state imaging device according to any one of (1) to (3) above, in which the conductive polymer has flexibility.

(6) The solid-state imaging device according to any one of (1) to (5) above, in which an insulation layer of the first multilayer wiring layer of the first semiconductor base is bonded to an insulation layer of the second multilayer wiring layer of the second semiconductor base.

(7) A method of producing a solid-state imaging device, including:

preparing a first semiconductor base that includes a first semiconductor layer in which a photoelectric conversion unit for performing photoelectric conversion is provided, a first multilayer wiring layer stacked on the first semiconductor layer, and a first metal pad formed on a surface of the first multilayer wiring layer on a side opposite to a surface thereof on a side of the first semiconductor layer, and a second semiconductor base that includes a second semiconductor layer in which an active element is provided, a second multilayer wiring layer stacked on the second semiconductor layer, and a second metal pad formed on a surface of the second multilayer wiring layer on a side opposite to a surface thereof on a side of the second semiconductor layer;

orienting a conductive polymer on at least one of the first metal pad and the second metal pad; and bonding the first multilayer wiring layer of the first semiconductor base and the second multilayer wiring layer of the second semiconductor base to each other.

(8) The method of producing a solid-state imaging device according to (7) above, further including selecting, before orienting the conductive polymer, functional groups that can be bonded to a metal forming the first metal pad and the second metal pad as functional groups included in the conductive polymer at both ends of the conductive polymer.

(9) The method of producing a solid-state imaging device according to (7) or (8) above, further including selecting, before orienting the conductive polymer, the degree of polymerization of a molecule forming the conductive polymer such that the conductive polymer has a chain length equal to or greater than a recess amount that is a sum of a recessed amount of the first metal pad and a recessed amount of the second metal pad.

(10) An electronic apparatus, including:

a solid-state imaging device that includes a first semiconductor base, a second semiconductor base bonded to the first semiconductor base, and a conductive polymer; and an optical system that forms an image of image light from a subject on the solid-state imaging device, the first semiconductor base including a first semiconductor layer in which a photoelectric conversion unit for performing photoelectric conversion is provided, a first multilayer wiring layer stacked on the first semiconductor layer, and a first metal pad formed on a surface of the first multilayer wiring layer on a side opposite to a surface thereof on a side of the first semiconductor layer, the second semiconductor base including a second semiconductor layer in which an active element is provided, a second multilayer wiring layer stacked on the second semiconductor layer, and a second metal pad formed on a surface of the second multilayer wiring layer on a side opposite to a surface thereof on a side of the second semiconductor layer, the conductive polymer being interposed between the first metal pad and the second metal pad and electrically connecting the first metal pad and the second metal pad to each other.

The scope of the present technology is not limited to the illustrated and descried exemplary embodiment, and includes all embodiments that provide effects equivalent to those for which the present technology is intended. Further, the scope of the present technology is not limited to the combination of the features of the inventions defined by the claims, and can be defined by any desired combination of the specific features of all the disclosed features.

REFERENCE SIGNS LIST 1 solid-state imaging device
2 sensor chip
10 first semiconductor base
10a pixel formation region
10b separation unit
11 first semiconductor layer
12 charge accumulation region
13 well region
14 light absorption unit
15 multiplication unit 15a first electrode region
15b second electrode region
15c avalanche multiplication region
16 n-type first contact region
17 p-type second contact region
21 first multilayer wiring layer
22 first interlayer insulating film
23a, 23b contact electrode
24a first metal wire
24b second metal wire
25a, 25b contact electrode
27, 27a, 27b first metal pad
28, 28a, 28b opening
30 second semiconductor base
31 second semiconductor layer
32 MOSFET
33 gate electrode
41 second multilayer wiring layer
42 second interlayer insulating film
43 wire
44 electrode pad
45 contact electrode
47, 47a, 47b second metal pad
48, 48a, 48b opening
50, 501, 502, 503 conductive polymer film
51, 51a, 51b, 51c, 511, 512, 513 conductive polymer
52, 521, 522, 523 polymer
53, 531, 532, 533 functional group
60 semiconductor wafer
63 first semiconductor wafer
64 second semiconductor wafer
71 flattening film
72 microlens layer
201 distance image apparatus

What is claimed is:

1. A solid-state imaging device, comprising:

a first semiconductor base;

a second semiconductor base bonded to the first semiconductor base; and a conductive polymer, the first semiconductor base including a first semiconductor layer in which a photoelectric conversion unit for performing photoelectric conversion is provided, a first multilayer wiring layer stacked on the first semiconductor layer, and a first metal pad formed on a surface of the first multilayer wiring layer on a side opposite to a surface thereof on a side of the first semiconductor layer, the second semiconductor base including a second semiconductor layer in which an active element is provided, a second multilayer wiring layer stacked on the second semiconductor layer, and a second metal pad formed on a surface of the second multilayer wiring layer on a side opposite to a surface thereof on a side of the second semiconductor layer, wherein the conductive polymer is interposed between the first metal pad and the second metal pad and electrically connecting the first metal pad and the second metal pad to each other, and wherein the conductive polymer has a chain length equal to or greater than a recess amount that is a sum of a recessed amount of the first metal pad and a recessed amount of the second metal pad.

2. The solid-state imaging device according to claim 1, wherein the conductive polymer includes, at both ends thereof, functional groups that are bonded to the first metal pad and the second metal pad.

3. A solid-state imaging device, comprising:

a first semiconductor base;

a second semiconductor base bonded to the first semiconductor base; and a conductive polymer, the first semiconductor base including a first semiconductor layer in which a photoelectric conversion unit for performing photoelectric conversion is provided, a first multilayer wiring layer stacked on the first semiconductor layer, and a first metal pad formed on a surface of the first multilayer wiring layer on a side opposite to a surface thereof on a side of the first semiconductor layer, the second semiconductor base including a second semiconductor layer in which an active element is provided, a second multilayer wiring layer stacked on the second semiconductor layer, and a second metal pad formed on a surface of the second multilayer wiring layer on a side opposite to a surface thereof on a side of the second semiconductor layer, wherein the conductive polymer is interposed between the first metal pad and the second metal pad and electrically connecting the first metal pad and the second metal pad to each other, and wherein the conductive polymer includes a first conductive polymer having a first chain length and a second conductive polymer having a second chain length shorter than the first chain length.

4. The solid-state imaging device according to claim 1, wherein the conductive polymer has flexibility.

5. The solid-state imaging device according to claim 1, wherein an insulation layer of the first multilayer wiring layer of the first semiconductor base is bonded to an insulation layer of the second multilayer wiring layer of the second semiconductor base.

6. An electronic apparatus, comprising:

a solid-state imaging device that includes a first semiconductor base, a second semiconductor base bonded to the first semiconductor base, and a conductive polymer; and an optical system that forms an image of image light from a subject on the solid-state imaging device, the first semiconductor base including a first semiconductor layer in which a photoelectric conversion unit for performing photoelectric conversion is provided, a first multilayer wiring layer stacked on the first semiconductor layer, and a first metal pad formed on a surface of the first multilayer wiring layer on a side opposite to a surface thereof on a side of the first semiconductor layer, the second semiconductor base including a second semiconductor layer in which an active element is provided, a second multilayer wiring layer stacked on the second semiconductor layer, and a second metal pad formed on a surface of the second multilayer wiring layer on a side opposite to a surface thereof on a side of the second semiconductor layer, wherein the conductive polymer is interposed between the first metal pad and the second metal pad and electrically connecting the first metal pad and the second metal pad to each other, and wherein the conductive polymer has a chain length equal to or greater than a recess amount that is a sum of a recessed amount of the first metal pad and a recessed amount of the second metal pad.

7. The electronic apparatus according to claim 6, wherein the conductive polymer includes, at both ends thereof, functional groups that are bonded to the first metal pad and the second metal pad.

8. The electronic apparatus according to claim 6, wherein the conductive polymer has flexibility.

9. The electronic apparatus according to claim 6, wherein an insulation layer of the first multilayer wiring layer of the first semiconductor base is bonded to an insulation layer of the second multilayer wiring layer of the second semiconductor base.

10. The solid-state imaging device according to claim 3, wherein an insulation layer of the first multilayer wiring layer of the first semiconductor base is bonded to an insulation layer of the second multilayer wiring layer of the second semiconductor base.

* * * * *